(12) United States Patent
Meyer et al.

(10) Patent No.: US 9,175,132 B2
(45) Date of Patent: Nov. 3, 2015

(54) POLYMERS COMPRISING STRUCTURAL UNITS WHICH CONTAIN ALKYLALKOXY GROUPS, BLENDS COMPRISING THESE POLYMERS, AND OPTO-ELECTRONIC DEVICES COMPRISING THESE POLYMERS AND BLENDS

(75) Inventors: Frank Egon Meyer, Winchester (GB); Niels Schulte, Kelkheim (DE); Anna Hayer, Mainz (DE); Aurélie Ludemann, Frankfurt am Main (DE); Rémi Manouk Anémian, Seoul (KR)

(73) Assignee: Merck Patent GmbH (DE)

( * ) Notice: Subject to any disclaimer, the term of this patent is extended or adjusted under 35 U.S.C. 154(b) by 664 days.

(21) Appl. No.: 13/379,394

(22) PCT Filed: Jun. 1, 2010

(86) PCT No.: PCT/EP2010/003323
§ 371 (c)(1),
(2), (4) Date: Dec. 20, 2011

(87) PCT Pub. No.: WO2010/149261
PCT Pub. Date: Dec. 29, 2010

(65) Prior Publication Data
US 2012/0097938 A1    Apr. 26, 2012

(30) Foreign Application Priority Data
Jun. 26, 2009  (DE) .................... 10 2009 030 848

(51) Int. Cl.

| | |
|---|---|
| *H01L 51/54* | (2006.01) |
| *H01L 51/30* | (2006.01) |
| *C08G 75/06* | (2006.01) |
| *C08L 79/02* | (2006.01) |
| *H01B 1/12* | (2006.01) |
| *H01L 51/46* | (2006.01) |
| *C08G 73/00* | (2006.01) |
| *C08L 81/02* | (2006.01) |
| *C08G 61/12* | (2006.01) |
| *C08G 61/02* | (2006.01) |
| *C08L 65/00* | (2006.01) |
| *C09K 11/06* | (2006.01) |
| *H05B 33/14* | (2006.01) |
| *H01L 51/00* | (2006.01) |

(52) U.S. Cl.
CPC .............. *C08G 61/12* (2013.01); *C08G 61/02* (2013.01); *C08L 65/00* (2013.01); *C09K 11/06* (2013.01); *H01L 51/0043* (2013.01); *H05B 33/14* (2013.01); *C08G 2261/1424* (2013.01); *C08G 2261/18* (2013.01); *C08G 2261/3142* (2013.01); *C08G 2261/411* (2013.01); *C08G 2261/5222* (2013.01); *C08L 2205/02* (2013.01); *C09K 2211/1007* (2013.01); *C09K 2211/1011* (2013.01); *C09K 2211/1416* (2013.01); *C09K 2211/1425* (2013.01); *C09K 2211/1433* (2013.01); *H01L 51/0039* (2013.01); *Y02E 10/549* (2013.01)

(58) Field of Classification Search
None
See application file for complete search history.

(56) References Cited

U.S. PATENT DOCUMENTS

| 6,344,286 | B1 | 2/2002 | Kim et al. | |
|---|---|---|---|---|
| 2002/0051895 | A1 | 5/2002 | Cho et al. | |
| 2003/0082402 | A1* | 5/2003 | Zheng et al. .................. | 428/690 |
| 2003/0224205 | A1* | 12/2003 | Li et al. .......................... | 428/690 |
| 2004/0062930 | A1* | 4/2004 | Roberts et al. ............. | 428/411.1 |
| 2004/0062947 | A1* | 4/2004 | Lamansky et al. ............ | 428/690 |
| 2004/0097699 | A1 | 5/2004 | Holmes et al. | |
| 2006/0046092 | A1 | 3/2006 | Towns et al. | |
| 2006/0149016 | A1* | 7/2006 | O'Dell et al. ..................... | 528/8 |
| 2007/0278455 | A1 | 12/2007 | Park et al. | |
| 2008/0142788 | A1 | 6/2008 | Li et al. | |

FOREIGN PATENT DOCUMENTS

| EP | 1468988 A1 | 10/2004 |
|---|---|---|
| EP | 1932865 A2 | 6/2008 |
| JP | 2002161130 A | 6/2002 |
| JP | 2004510298 A | 4/2004 |
| JP | 2006517595 A | 7/2006 |
| JP | 2006225461 A | 8/2006 |
| JP | 2007-033864 A | 2/2007 |
| JP | 2008153667 A | 7/2008 |
| WO | WO-97/33323 A1 | 9/1997 |
| WO | WO-99/48160 A1 | 9/1999 |
| WO | WO-03089542 A1 | 10/2003 |
| WO | WO-2004041091 A1 | 5/2004 |
| WO | WO-2008/011953 A1 | 1/2008 |
| WO | WO-2009065479 A1 | 5/2009 |

OTHER PUBLICATIONS

Japanese Office Action for Application No. 2012-516541, dated Dec. 6, 2013.
Kelley, et al., "The Synthesis of Bridged Oligophenylenes from Fluorene 2 Quinquiphenys to Deciphenyls", Journal of Chemical Research, vol. 2, No. 1, (1999), pp. 401-418.
Salaneck, et al., "The Metal-on-Polymer Interface in Polymer Light Emitting Diodes", Advanced Materials, vol. 8, No. 1 (1996), pp. 48-52.
International Search Report for PCT/EP2010/003323, mailed Aug. 31, 2010.
Boyd et al., "Sulfonation and Epoxidation of Substituted Polynorbornenes and Construction of Light-Emitting Devices", Macromolecules, vol. 32(20) pp. 6608-6618 (1999).
Japanese Office Action for Application No. 2012-516541, mailed Sep. 30, 2014.

\* cited by examiner

*Primary Examiner* — Andrew K Bohaty
(74) *Attorney, Agent, or Firm* — Drinker Biddle & Reath LLP

(57) ABSTRACT

The present invention relates to polymers comprising structural units which contain alkylalkoxy groups, and blends which comprise the polymers according to the invention. The invention is also directed to the use of the polymers and blends according to the invention in opto-electronic devices and to these devices themselves.

22 Claims, No Drawings

POLYMERS COMPRISING STRUCTURAL UNITS WHICH CONTAIN ALKYLALKOXY GROUPS, BLENDS COMPRISING THESE POLYMERS, AND OPTO-ELECTRONIC DEVICES COMPRISING THESE POLYMERS AND BLENDS

CROSS-REFERENCE TO RELATED APPLICATIONS

This application is a national stage application (under 35 U.S.C. §371) of PCT/EP2010/003323, filed Jun. 1, 2010, which claims benefit of German application 10 2009 030 848.2, filed Jun. 26, 2009.

BACKGROUND OF THE INVENTION

The present invention relates to polymers comprising structural units which contain alkylalkoxy groups, and blends which comprise the polymers according to the invention. The invention is also directed to the use of the polymers and blends according to the invention in opto-electronic devices and to these devices themselves.

Electronic devices which comprise organic, organometallic and/or polymeric semiconductors are being used ever more frequently in commercial products or are just about to be introduced onto the market. Examples which may be mentioned here are charge-transport materials on an organic basis (for example hole transporters based on triarylamine) in photocopiers and organic or polymeric light-emitting diodes (OLEDs or PLEDs) in display devices or organic photoreceptors in copiers. Organic solar cells (O-SCs), organic field-effect transistors (O-FETs), organic thin-film transistors (O-TFTs), organic integrated circuits (O-ICs), organic optical amplifiers or organic laser diodes (O-lasers) are in an advanced stage of development and may achieve major importance in the future.

Many of these electronic devices have, irrespective of the respective application, the following general layer structure, which can be adapted for the respective application:
(1) substrate,
(2) electrode, frequently metallic or inorganic, but also comprising organic or polymeric conductive materials,
(3) charge-injection layer(s) or interlayer(s), for example for compensation of the unevenness of the electrode ("planarisation layer"), frequently comprising a conductive, doped polymer,
(4) organic semiconductor,
(5) optionally further charge-transport or charge-injection or charge-blocking layers,
(6) counterelectrode, materials as mentioned under (2),
(7) encapsulation.

The above arrangement represents the general structure of an organic electronic device, where various layers may be combined, meaning that in the simplest case an arrangement results from two electrodes, between which an organic layer is located. The organic layer in this case fulfils all functions, including the emission of light. A system of this type is described, for example, in WO 90/13148 A1 on the basis of poly(p-phenylenes).

In the case of a solution-processed system, this individual layer can either be a copolymer, in which case the corresponding functional units are present in the main chain or side chain of the polymer, or it can be a polymer blend, in which case different polymers comprise one or more functional units as structural units, or it may comprise soluble small molecules or mixtures of one or more polymers with one or more small molecules. All variants exhibit advantages and disadvantages. However, a main problem is the operating voltage of such systems, which is still relatively high, inadequate efficiency and an inadequate lifetime.

Solution-processable materials for OLEDs have caused a lot of excitement recently, in particular for a new generation of flat screens or as lighting element. Although great improvements in solution-processed OLEDs have been achieved in recent years, they still exhibit deficits with respect to their efficiency and lifetime compared with vacuum-evaporated SMOLED devices. By contrast, the advantage lies in simple processing from solution, where various layers can easily be produced by known coating methods (printing, spin coating), in contrast to a complex vapour-deposition process in a vacuum chamber.

Colour homogeneity is also in some cases very difficult to establish in the case of vapour-deposited small molecules, since small amounts of a dopant have to be dispensed accurately. In the case of copolymers, polymer blends or small molecules in solution, the requisite components, such as, for example, emitters or charge-transport units, can be dispensed very accurately in the correct concentration.

Many OLEDs in accordance with the prior art comprise an active polymer within a layer, where the polymer comprises all requisite functional units. This polymer layer is frequently applied to an interlayer, which is responsible, for example, for hole injection.

Polymer blends can also be employed and may be useful for various purposes, for example for white-emitting devices via a mixture of polymers emitting in different colours (turquoise and yellow, red, green and blue in increasing concentrations, for example GB 2340304), for improving hole injection in order to render an interlayer superfluous (for example WO 2008/011953), or in order to adapt the rheological properties by employing polymers having different properties.

Polymer blends frequently do not exhibit advantages overall over copolymers, but are nevertheless employed. However, systems in which the blend produces additional advantages over a copolymer would be advantageous. In WO 99/48160, an advantage of this type is achieved for the performance data of the OLED produced: a mixture is used in which the highest HOMO (highest occupied molecular orbital) in the mixture and the lowest LUMO (lowest unoccupied molecular orbital) in the mixture are localised on two different components, i.e. these two components form a so-called "type II heterojunction", i.e. the component having the higher HOMO also has the higher LUMO. Thus, the separation between the HOMO relevant for hole injection and the LUMO relevant for electron injection is reduced without the band gap of the individual components being reduced and thus the emission colour being shifted to lower energy. Charge-carrier injection is thus simplified independently of the emission colour of the OLED component, i.e. also for deep blue-emitting OLEDs.

BRIEF SUMMARY OF THE INVENTION

The present invention also encompasses, inter alia, blends which offer an advantage for performance data over copolymers without the components having to meet the restriction of forming a so-called "type II heterojunction".

The object of the present invention is the provision of compounds which, on use in organic electronic devices, cause a lower operating voltage and an increased component lifetime at the same time as good efficiency, whether as polymer or blend.

Surprisingly, it has been found that polymers or polymer blends comprising polymers which comprise structural units which contain alkylalkoxy groups which are not bonded directly to the structural unit via an oxygen atom result in a reduction in the operating voltage. This has been demonstrated both in the case of polymers and also in the case of polymer blends which comprise the polymers according to the invention. In addition, it has also been possible to increase the efficiency and lifetime of these systems.

To this end, the present invention provides a polymer comprising, as structural unit Z, an aromatic or heteroaromatic ring system, where at least one H atom of the aromatic or heteroaromatic ring system is substituted by an alkylalkoxy group A which is bonded to the aromatic or heteroaromatic ring system via a C atom of the alkylalkoxy group and where the aromatic or heteroaromatic ring system is substituted by one or more substituents $R^1$ of any desired type.

A DETAILED DESCRIPTION OF THE INVENTION

In an embodiment of the invention, the alkylalkoxy group A is preferably bonded to the aromatic or heteroaromatic ring system via an aromatic or heteroaromatic group Ar.

In a further embodiment of the invention, the alkylalkoxy group A conforms to the formula $-Ar_n-(CR_2)_m-O-(CR_2)_o-O_x-(CR_2)_p-CR_3$, in which R can adopt, independently of one another, identically or differently, one of the meanings indicated for $R^1$, but preferably denotes H, and in which individual $CR_2$ groups may be replaced by alkenyl, alkynyl, aryl or heteroaryl groups, $n \geq 0$, $m > 0$, $o \geq 0$, x is 0 or 1 and $p \geq 0$, where x is equal to 0 if o and p are equal to 0.

All embodiments have the common feature that the alkylalkoxy group A is bonded to the structural unit Z not via an oxygen atom, but instead via a carbon atom. This causes an electronic effect which results in the reduction of the operating voltage of an organic electronic device which comprises a polymer according to the invention.

For the purposes of the present invention, the structural unit Z is an aromatic or heteroaromatic ring system, preferably having 5 to 60 ring atoms, which may be substituted by one or more radicals $R^1$ of any desired type. Z forms the skeleton of the compound of the general formula I and, after successful polymerisation, forms the so-called polymer backbone.

The aromatic ring system in the sense of the present contains 5 to 60 C atoms in the ring system. The heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se, particularly preferably selected from N, P, O and/or S. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, a C ($sp^3$-hybridised), N or O atom. Thus, for example, systems such as, for example, 9,9'-spirobifluorene, 9,9-diarylfluorene, triarylamine, diaryl ether and stilbene are also intended to be taken to be aromatic ring systems in the sense of the present invention, as are systems in which two or more aryl groups are interrupted, for example, by a linear or cyclic alkyl group or by a silyl group. P=O or C=O groups are usually not conjugation-interrupting.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene.

In the polymer according to the invention, it is preferred that $R^1$ is in each case, independently of one another, a bond to a further structural unit or denotes H, D, F, Cl, Br, I, $N(R^2)_2$, $N(Ar)_2$, C(=O)Ar, P(=O)Ar$_2$, S(=O)Ar, S(=O)$_2$Ar, $CR^2$=$CR^2$Ar, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^2$, where one or more non-adjacent $CH_2$ groups may be replaced by $R^2C$=$CR^2$, C=C, $Si(R^2)_2$, $Ge(R^2)_2$, $Sn(R^2)_2$, C=O, C=S, C=Se, C=$NR^2$, P(=O)($R^2$), SO, $SO_2$, $NR^2$, O, S or CON$R^2$ and where one or more H atoms may be replaced by F, Cl, Br, I, CN or $NO_2$, or an aromatic or heteroaromatic ring system having 5 to 40 ring atoms, which may in each case be substituted by one or more radicals $R^2$, or an aryl, heteroaryl, aryloxy or heteroaryloxy group having 5 to 60 ring atoms, which may be substituted by one or more radicals $R^2$, or a combination of these systems; where, in addition, two or more substituents R may also form a mono- or polycyclic, aliphatic or aromatic ring system with one another, and $R^2$ is in each case, independently of one another, H or an aliphatic or aromatic hydrocarbon radical having 1 to 20 C atoms.

An aryl group in the sense of the present invention contains 5 to 60 C atoms; a heteroaryl group in the sense of the present invention contains 2 to 60 C atoms and at least one heteroatom, with the proviso that the sum of C atoms and heteroatoms is at least 5. The heteroatoms are preferably selected from Si, N, P, O, S and/or Se, particularly preferably selected from N, P, O and/or S. An aryl group or heteroaryl group here is taken to mean either a simple aromatic ring, i.e. benzene, or a simple heteroaromatic ring, for example pyridine, pyrimidine and thiophene, or a condensed aryl or heteroaryl group, for example naphthalene, anthracene, phenanthrene, quinoline, isoquinoline, benzothiophene, benzofuran and indole.

For the purposes of the present invention, an alkyl group having 1 to 40 C atoms, in which, in addition, individual H atoms or $CH_2$ groups may be substituted by the above-mentioned groups or radicals $R^2$, is preferably taken to mean the radicals methyl, ethyl, n-propyl, i-propyl, cyclopropyl, n-butyl, i-butyl, s-butyl, t-butyl, cyclobutyl, 2-methylbutyl, n-pentyl, s-pentyl, cyclopentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy or 2-methylbutoxy.

In an embodiment of the invention, it is preferred for the structural unit Z to be selected from substituted or unsubstituted trans-indenofluorene, benzotrans-indenofluorene, dibenzo-trans-indenofluorene, cis-indenofluorene, benzo-cis-indenofluorene, dibenzo-cis-indenofluorene, spirobifluorene, dihydrophenanthrene, phenanthrene, fluorene, dibenzofuran, benzofluorene, benzochromene, dibenzooxepine and anthracene, and derivatives of the said structural units.

In a further embodiment of the present invention, the structural unit Z conforms to the general formula I

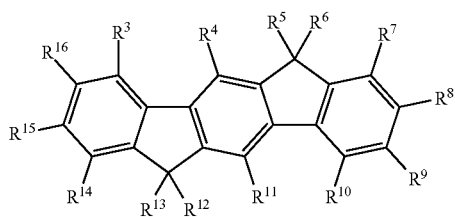

I where at least one of the radicals $R^3$ to $R^{16}$, but preferably two of the radicals $R^3$ to $R^{16}$, denote(s) a bond to a further structural unit, at least one of the radicals $R^3$ to $R^{16}$ denotes a linear or branched alkylalkoxy group A which is bonded to the compound of the general formula I via a C atom, and where the remaining radicals $R^3$ to $R^{16}$ have the meanings indicated for $R^1$. The compound is a trans-indenofluorene. It is particularly preferred for at least one of the radicals $R^5$, $R^6$, $R^{12}$ and/or $R^{13}$ to denote an alkylalkoxy group A.

In a further embodiment of the present invention, the structural unit Z conforms to the formula Ia, Ib or Ic:

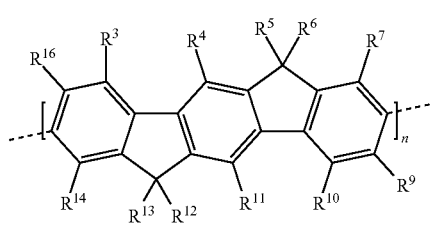

Ia

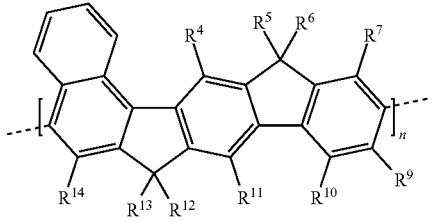

Ib

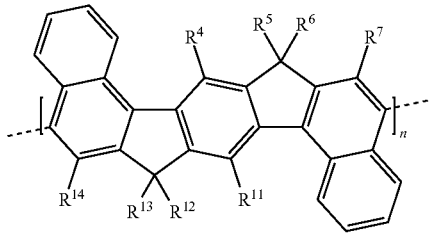

Ic where n≥1, preferably >1, and where the symbols and indices have the meanings indicated above. It is particularly preferred for at least one of the radicals $R^5$, $R^6$, $R^{12}$ and/or $R^{13}$ to denote an alkylalkoxy group A. The dashed lines here represent the bonds to the adjacent structural units in the polymer.

In a further embodiment of the present invention, the structural unit Z corresponds to the compound of the general formula II

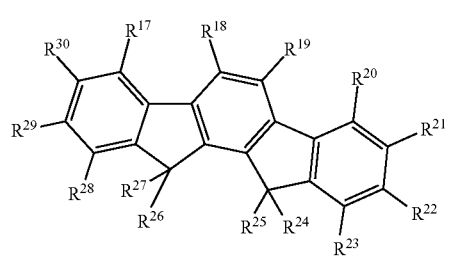

II where at least one of the radicals $R^{17}$ to $R^{30}$, but preferably two of the radicals $R^{17}$ to $R^{30}$, denote(s) a bond to a further structural unit, at least one of the radicals $R^{17}$ to $R^{30}$ denotes a linear or branched alkylalkoxy group A which is bonded to the compound of the general formula II via a C atom and where the remaining radicals $R^{17}$ to $R^{30}$ have the meanings indicated for $R^1$. It is particularly preferred for at least one of the radicals $R^{24}$, $R^{25}$, $R^{26}$ and/or $R^{27}$ to denote an alkylalkoxy group A.

The structural unit Z furthermore preferably corresponds to the compounds of the formula IIa, IIb or IIc:

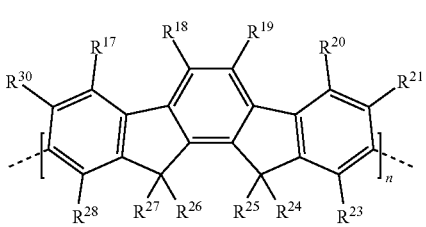

IIa

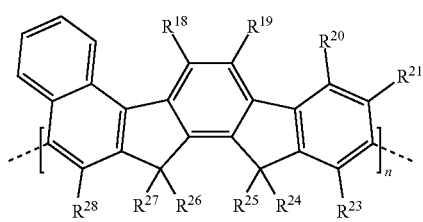
IIb

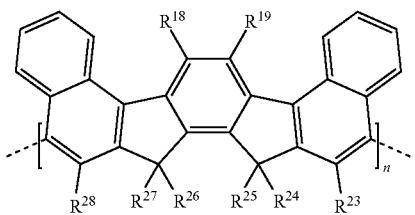
IIc where n≥1, preferably >1, and where the symbols and indices have the meanings indicated above. It is particularly preferred for at least one of the radicals $R^{24}$, $R^{25}$, $R^{26}$ and/or $R^{27}$ to denote an alkylalkoxy group A. The dashed lines here represent the bonds to the adjacent structural units in the polymer.

In still a further embodiment of the present invention, the structural unit Z conforms to the general formula III

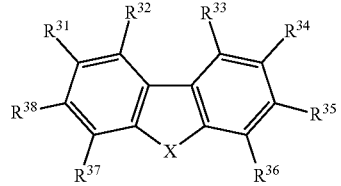
III where at least one of the radicals $R^{31}$ to $R^{38}$, but preferably two of the radicals $R^{31}$ to $R^{38}$, denote(s) a bond to a further structural unit, at least one of the radicals $R^{31}$ to $R^{38}$ denotes a linear or branched alkylalkoxy group A which is bonded to the compound of the general formula III via a C atom, the remaining radicals $R^{31}$ to $R^{38}$ have the meanings indicated for $R^1$, and X is equal to $CR^1{}_2$, $NR^1$, O, —$CH_2$—, —$CH_2$—$CH_2$—, —CH═CH—, —O—$CH_2$—, —$CH_2$—O—$CH_2$—, $CAR^1$ or $CA_2$. In the radicals $CAR^1$ and $CA_2$, A is intended to represent the alkylalkoxy group employed in accordance with the invention.

In a further embodiment of the present invention, the structural unit Z conforms to the formula IIIa, IIIb, IIIc, IIId, IIIe, IIIf or IIIg:

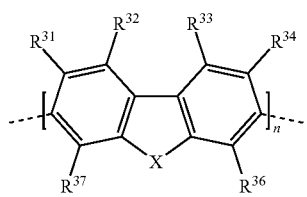
IIIa

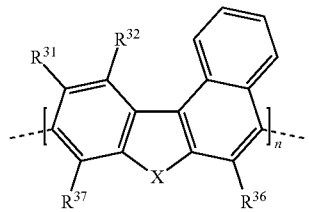
IIIb

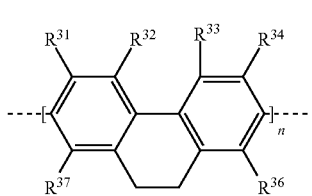
IIIc

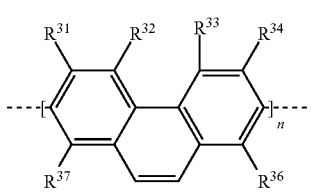
IIId

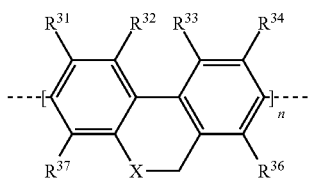
IIIe

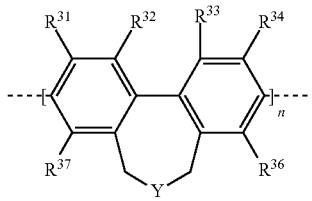
IIIf

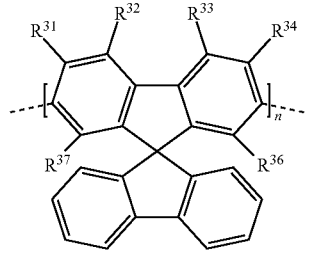
IIIg where n≥1, preferably >1, and where the symbols and indices have the meanings indicated above, and Y, in addition, is equal to $NR^1$, O, —CH═CH—, —O—$CH_2$—, —$CH_2$—O—$CH_2$—, $CAR^1$ or $CA_2$. In the radicals $CAR^1$ and $CA_2$, A is intended to represent the alkylalkoxy group employed in accordance with the invention. The dashed lines here represent the bonds to the adjacent structural units in the polymer.

In still a further embodiment of the present invention, the structural unit Z conforms to the general formula IV

IV

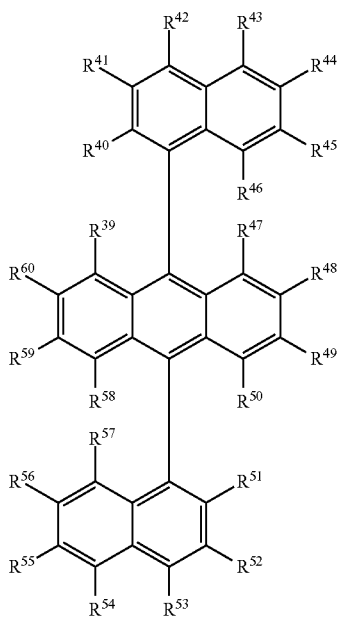

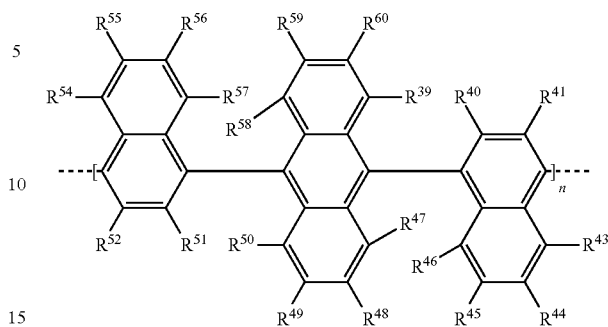

where n≥1, preferably >1, and where the symbols and indices have the meanings indicated above. The dashed lines here represent the bonds to the adjacent structural units in the polymer.

Examples of structural units according to the invention are compounds 1 to 7 depicted below:

where at least one of the radicals $R^{39}$ to $R^{60}$, but preferably two of the radicals $R^{39}$ to $R^{60}$, denote(s) a bond to a further structural unit, at least one of the radicals $R^{39}$ to $R^{60}$ denotes a linear or branched alkylalkoxy group A which is bonded to the compound of the general formula IV via a C atom, and the remaining radicals $R^{39}$ to $R^{60}$ have the meanings indicated for $R^1$.

The structural unit Z furthermore preferably conforms to the general formula IVa or IVb:

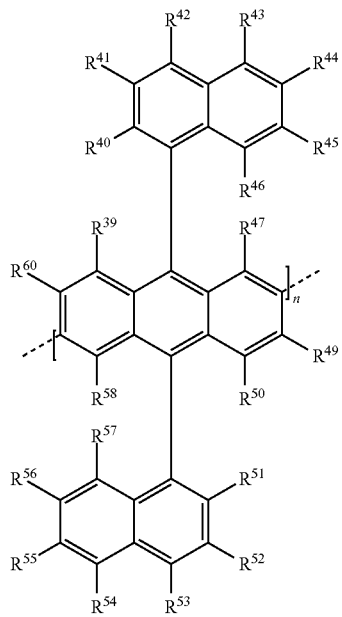

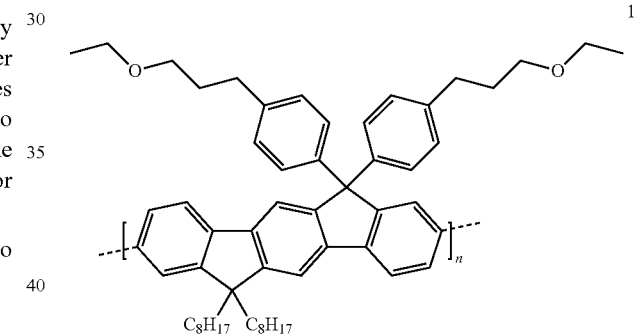

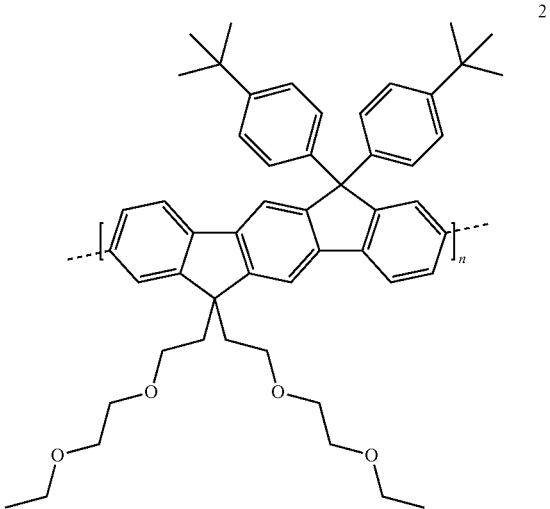

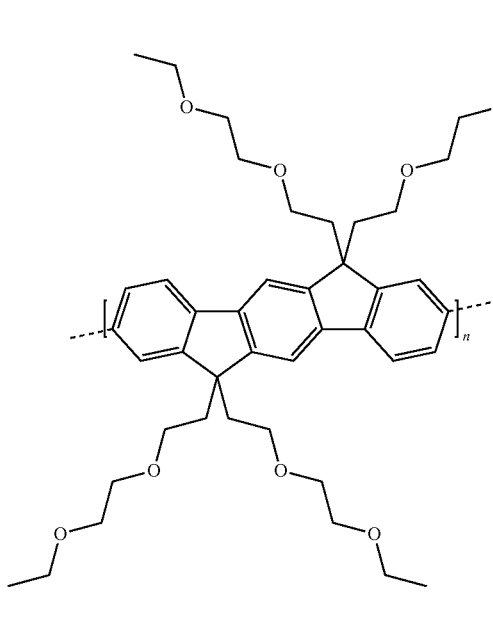

3

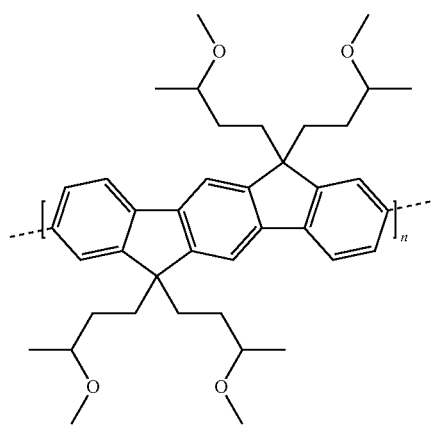

4

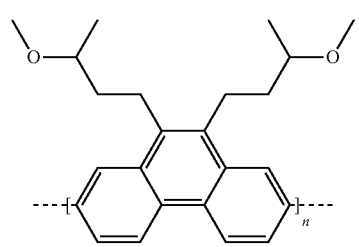

5

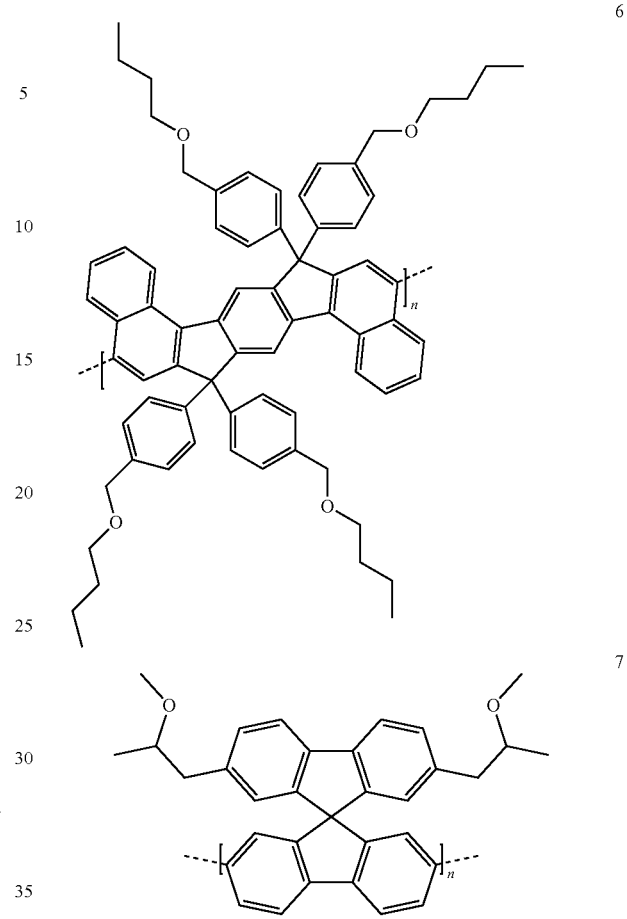

6

7

A polymer in the sense of the present invention is also intended to be taken to mean an oligomer and a dendrimer.

For the purposes of the present invention, the term oligomer is applied to a compound which has three to nine recurring units. A polymer in the sense of the invention is taken to mean a compound which has ten or more recurring units. The branching factor of the polymers here is between 0 (linear polymer, no branching points) and 1 (fully branched dendrimer).

The oligomers, polymers or dendrimers may be conjugated, partially conjugated or non-conjugated. The oligomers or polymers may be linear, branched or dendritic. In the structures linked in a linear manner, the structural units Z can either be linked directly to one another or they can be linked to one another via a divalent group, for example via a substituted or unsubstituted alkylene group, via a heteroatom or via a divalent aromatic or heteroaromatic group. In branched structures, for example, three or more structural units Z can be linked via a trivalent or polyvalent group, for example via a trivalent or polyvalent aromatic or heteroaromatic group, to form a branched oligomer or polymer.

The proportion of the structural unit Z in the polymer is preferably in the range from 0.01 to 100 mol %, particularly preferably in the range from 0.1 to 50 mol % and especially preferably in the range from 0.5 to 30 mol %.

The molecular weight $M_w$ of the polymer according to the invention is preferably in the range from 10,000 to 2,000,000 g/mol, particularly preferably in the range from 100,000 to 1,500,000 g/mol, and especially preferably in the range from 200,000 to 1,000,000 g/mol. The molecular weight $M_w$ is determined via GPC (=gel permeation chromatography) against an internal polystyrene standard.

Besides one or more structural units Z, the polymers according to the invention may also comprise further structural units which are different from the above-mentioned structural units Z. These are, inter alia, those as disclosed and listed extensively in WO 02/077060 A1 and in WO 2005/014689 A2. These are incorporated into the present invention by way of reference. The further structural units can originate, for example, from the following classes:

Group 1: units which influence the hole-injection and/or hole-transport properties of the polymers;
Group 2: units which influence the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film-morphological properties of the film and/or the rheological properties of the resultant polymers.

Preferred polymers according to the invention are those in which at least one structural unit has charge-transport properties, i.e. which comprise units from group 1 and/or group 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −1.5 eV (against vacuum level), particularly preferably less than −2.0 eV.

It may be preferred for the polymers according to the invention to comprise units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units from group 5 are those which improve transfer from the singlet state to the triplet state and which, employed in support of the structural units from group 4, improve the phosphorescence properties of these structural units. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, as well as triarylamines or styryltriarylamines, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological properties of the film and/or the rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which, besides structural units Z, at the same time additionally comprise one or more units selected from groups 1 to 8 which are different from the structural units according to the invention. It may likewise be preferred for more than one structural unit from one group to be present at the same time.

Preference is given here to polymers according to the invention which, besides at least one structural unit Z, also comprise units from group 7, particularly preferably at least 50 mol % of these units, based on the total number of structural units in the polymer.

It is likewise preferred for the polymers according to the invention to comprise units which improve the charge transport or charge injection, i.e. units from group 1 and/or 2; a proportion of 0.5 to 30 mol % of these units is particularly preferred; a proportion of 1 to 10 mol % of these units is very particularly preferred.

It is furthermore particularly preferred for the polymers according to the invention to comprise structural units from group 7 and units from groups 1 and/or 2, in particular at least 50 mol % of units from group 7 and 0.5 to 30 mol % of units from group 1 and/or 2.

It is furthermore particularly preferred for the polymers according to the invention to comprise structural units from group 6 and units from groups 1 and/or 2, in particular at least 5 mol % of units from group 6 and 0.5 to 30 mol % of units from group 1 and/or 2.

The polymers according to the invention are either homopolymers comprising structural units Z or copolymers. The polymers according to the invention may be linear, branched or crosslinked. Besides one or more structural units Z and preferred sub-formulae thereof, copolymers according to the invention may potentially have one or more further structures from groups 1 to 8 given above.

In further embodiments of the invention, a further structural unit is preferably selected from the following structural units Va, Vb, Vc, Vd, Ve, Vf, Vg and Vh:

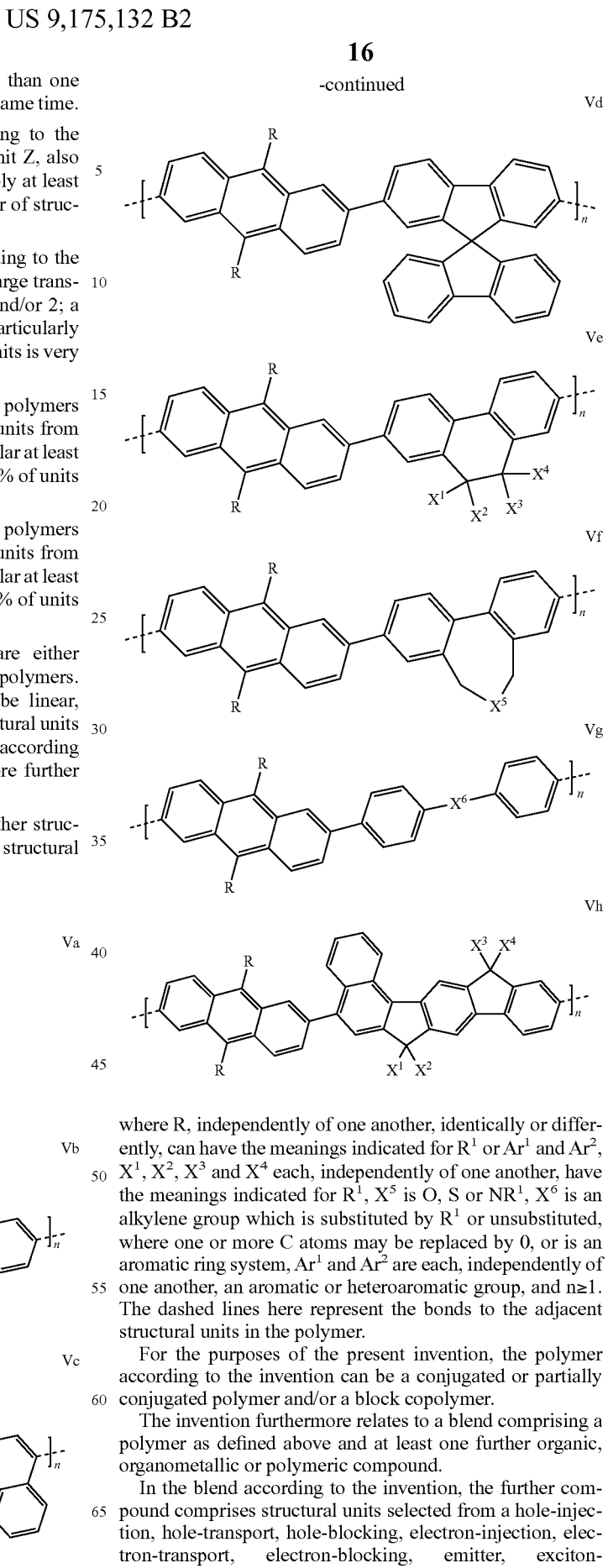

where R, independently of one another, identically or differently, can have the meanings indicated for $R^1$ or $Ar^1$ and $Ar^2$, $X^1$, $X^2$, $X^3$ and $X^4$ each, independently of one another, have the meanings indicated for $R^1$, $X^5$ is O, S or $NR^1$, $X^6$ is an alkylene group which is substituted by $R^1$ or unsubstituted, where one or more C atoms may be replaced by 0, or is an aromatic ring system, $Ar^1$ and $Ar^2$ are each, independently of one another, an aromatic or heteroaromatic group, and n≥1. The dashed lines here represent the bonds to the adjacent structural units in the polymer.

For the purposes of the present invention, the polymer according to the invention can be a conjugated or partially conjugated polymer and/or a block copolymer.

The invention furthermore relates to a blend comprising a polymer as defined above and at least one further organic, organometallic or polymeric compound.

In the blend according to the invention, the further compound comprises structural units selected from a hole-injection, hole-transport, hole-blocking, electron-injection, electron-transport, electron-blocking, emitter, exciton-generating unit or a backbone unit, and combinations thereof. The further compound may additionally comprise the above-defined structural units from groups 1 to 8.

The further polymeric compound of the blend particularly preferably comprises the structural units Va, Vb, Vc, Vd, Ve, Vf, Vg and Vh:

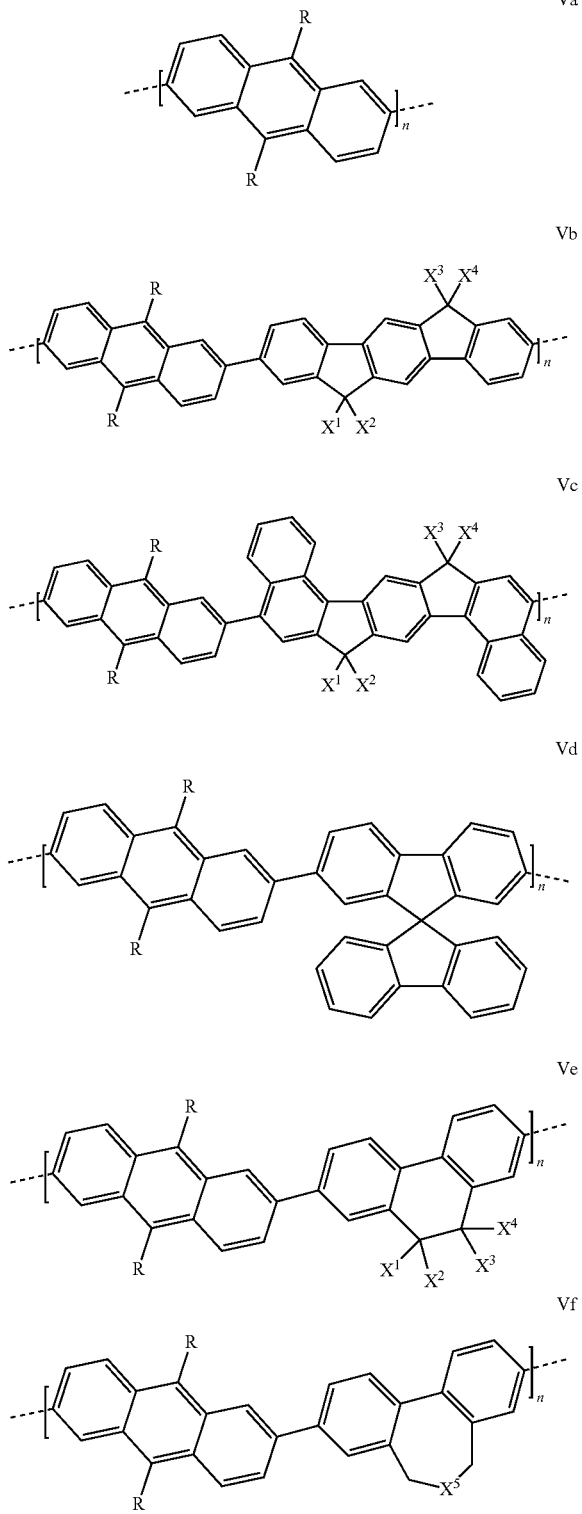

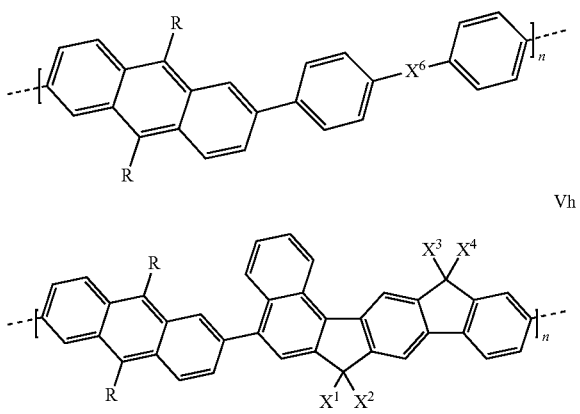

where R, independently of one another, identically or differently, can have the meanings indicated for $R^1$ or $Ar^1$ and $Ar^2$, $X^1$, $X^2$, $X^3$ and $X^4$ each, independently of one another, have the meanings indicated for $R^1$, $X^5$ is O, S or $NR^1$, $X^6$ is an alkylene group which is substituted by $R^1$ or unsubstituted, where one or more C atoms may be replaced by 0, or is an aromatic ring system, $Ar^1$ and $Ar^2$ are each, independently of one another, an aromatic or heteroaromatic group, and n≥1. The dashed lines here represent the bonds to the adjacent structural units in the polymer.

In a preferred embodiment of the invention, the blend comprises a polymer as defined above and a polymeric compound comprising an emitter unit and a hole-blocking unit.

In a further preferred embodiment of the invention, the blend comprises a polymer as defined above, a polymeric compound comprising an emitter unit and a polymeric compound comprising a hole-blocking unit. This is a blend which is built up from at least three polymer components. The blend may also additionally comprise further polymeric compounds or polymers. Preference is given to a blend comprising three or more polymers. It is particularly preferred for in each case one polymer in the blend to comprise a polymer backbone and only one type of functional unit. A blend can thus be built up as follows in accordance with the invention: polymer comprising structural units according to the invention and
polymer comprising hole-injection units and/or
polymer comprising hole-transport units and/or
polymer comprising hole-blocking units and/or
polymer comprising emitter units and/or
polymer comprising electron-injection units and/or
polymer comprising electron-transport units and/or
polymer comprising electron-blocking units and/or
polymer comprising exciton-generating units.

Preference is thus also given in accordance with the invention to a blend comprising further polymers, each of which comprise, independently of one another, a hole-injection, hole-transport, hole-blocking, electron-injection, electron-transport, electron-blocking, emitter or exciton-generating unit.

Preference is given to a blend in which the individual components do not form a so-called "type II heterojunction", i.e. a blend in which the component having the higher HOMO does not also have the higher LUMO. Particular preference is given to a blend in which the LUMOs of the components involved are the same.

In order to be able to polymerise the structural units Z and any further structural units, the structural units preferably contain leaving groups which are accessible to a coupling reaction, preferably a metal-catalysed cross-coupling reaction. The compounds functionalised with the leaving groups represent the basis for polymerisation. Thus, bromine derivatives can be reacted with arylboronic acids or arylboronic acid derivatives by Suzuki coupling or with organotin compounds by a Stille reaction to give the corresponding oligomers, polymers or dendrimers.

These processes are known in the prior art. Thus, the Suzuki coupling is, for example, a cross-coupling reaction for the formation of diphenyl derivatives or vinylaromatic compounds, where arylboronic acids are preferably reacted with haloaromatic compounds with catalytic use of, preferably, palladium-phosphine complexes. The reactivity of the aromatic compounds increases from bromine via trifluoromethanesulfonic acid esters to iodine, where in the meantime even weakly reactive chloroaromatic compounds can be reacted with palladium-phosphine catalysts. The Stille cross-coupling reaction proceeds analogously, using organotin compounds instead of organoboron compounds, although the former are not preferred owing to their high toxicity.

For the purposes of the present invention, particular preference is given to structural units which are substituted by reactive leaving groups, such as, for example, bromine, iodine, boronic acid, boronic acid ester, tosylate or triflate. These can also be used as comonomers for the production of corresponding conjugated, partially conjugated or non-conjugated polymers, oligomers or also as the core of dendrimers. The polymerisation here is preferably carried out via the halogen functionality or the boronic acid functionality.

Particular preference is given in this connection to the following dibromo-substituted compounds or boronic acid derivatives thereof or combinations thereof:

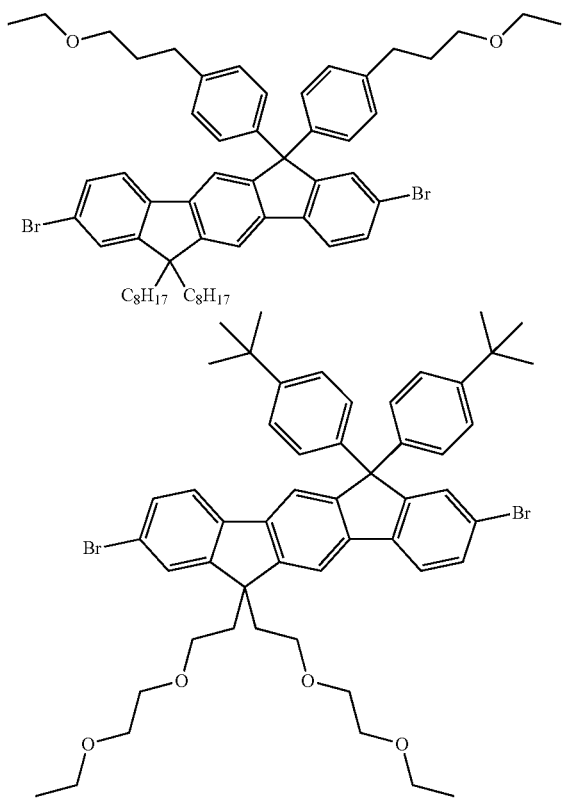

-continued

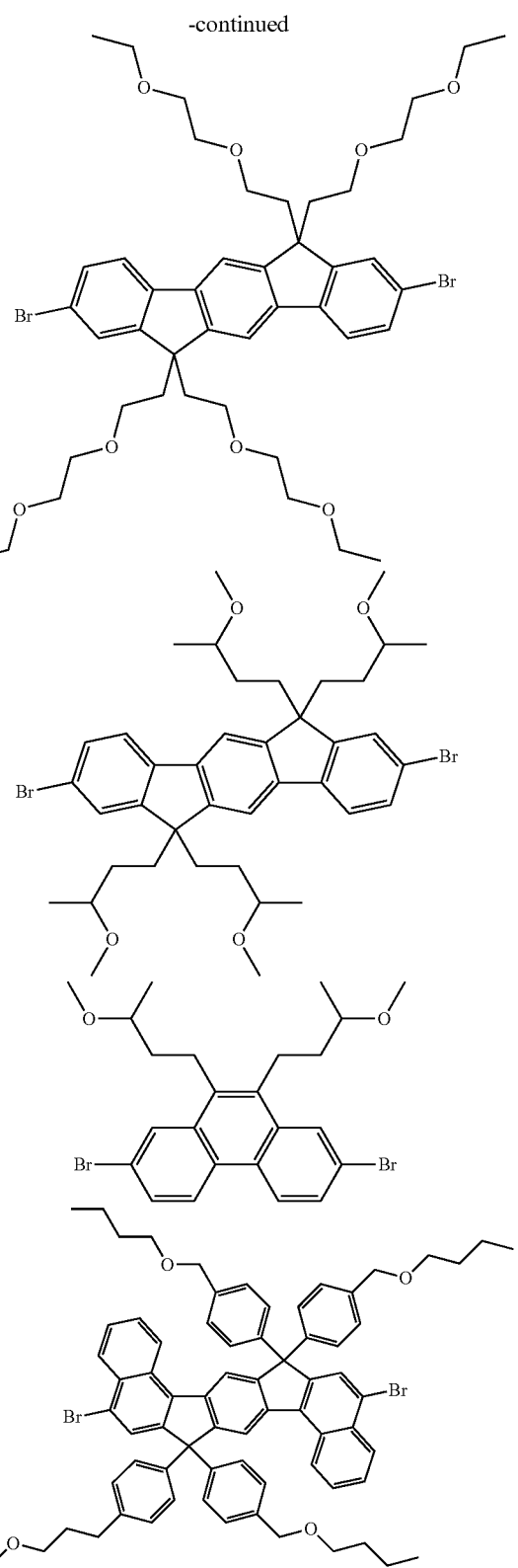

The polymers according to the invention or the blends according to the invention can be used in an organic electronic device, in which the polymer or blend is preferably within an organic layer. The organic layer may furthermore comprise further constituents, for example low-molecular-weight compounds or compounds which improve the film-formation properties. For the production of the organic layer, a liquid formulation comprising the polymer according to the invention or the blend according to the invention and one or more solvents is usually prepared by coating from solution. The techniques necessary for this purpose are known to the person skilled in the art. The polymer layer can be produced, for example, by coating from solution, for example spin coating. After application of the polymer layer and removal of the solvent, the polymer can additionally be crosslinked. The crosslinking can be carried out with radiation induction (for example with UV light, visible light, microwaves, electron beams) or thermally. However, substituents which are suitable for crosslinking, for example vinyl groups, must be present.

The invention thus also relates to a formulation comprising a polymer according to the invention or a blend according to the invention and one or more solvents. The way in which formulations of this type can be prepared is known to the person skilled in the art and is described, for example, in WO 02/072714, WO 03/019694 and the literature cited therein.

Suitable and preferred solvents are, for example, toluene, anisoles, xylenes, methyl benzoate, dimethyl anisoles, mesitylenes, tetralin, veratrols and tetrahydrofuran or mixtures thereof.

The present invention furthermore relates to an organic electronic device comprising one or more organic layers, where at least one layer comprises a polymer according to the invention or a blend according to the invention.

In a further embodiment of the present invention, the device comprises a plurality of layers. These can be layers which comprise the polymer according to the invention or the blend according to the invention or layers which comprise polymers which are independent thereof, blends or low-molecular-weight compounds. The polymer according to the invention or the blend according to the invention can be present here in the form of a hole-transport, hole-injection, emitter, electron-transport, electron-injection, charge-blocking and/or charge-generation layer.

The organic electroluminescent device may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013). White-emitting devices are suitable, for example, as lighting or backlighting of displays (LCDs).

In a further preferred embodiment, the device comprises a plurality of layers, one of which is an emission layer and one of which is an electron-injection layer comprising the polymer according to the invention.

Apart from these layers, the device may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). It is likewise possible for interlayers, which have, for example, an exciton-blocking function, to be introduced between two emitting layers. However, it should be pointed out that each of these layers does not necessarily have to be present. These layers may likewise comprise the polymers or blends according to the invention, as defined above. It is also possible for a plurality of OLEDs to be arranged one above the other, which enables a further increase in efficiency with respect to the light yield to be achieved. In order to improve the coupling-out of light, the final organic layer on the light exit side in OLEDs can also be designed as a nanofoam, which reduces the proportion of total reflection.

The device may furthermore comprise layers which are built up from small molecules (SMOLEDs). These can be produced, for example, by evaporation of small molecules in a high vacuum.

Preference is thus furthermore given to an organic electroluminescent device in which one or more layers are applied by means of a sublimation process, in which the materials are vapour-deposited in vacuum sublimation units at a pressure of less than $10^{-5}$ mbar, preferably less than $10^{-6}$ mbar, and particularly preferably less than $10^{-7}$ mbar.

Preference is likewise given to an organic electroluminescent device which is characterised in that one or more layers are applied by means of the OVPD (organic vapour phase deposition) process or with the aid of carrier-gas sublimation, where the materials are applied at a pressure of between $10^{-5}$ mbar and 1 bar.

Preference is furthermore given to an organic electroluminescent device in which one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds, which are obtained, if necessary, by suitable substitution, are necessary for this purpose.

The organic electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic light-emitting transistor (O-LET), an organic solar cell (O-SC), an organic optical detector, an organic photoreceptor, an organic field-quench device (O-FQD), a light-emitting electrochemical cell (LEC) or an organic laser diode (O-laser).

The device usually comprises a cathode and an anode (electrodes). For the purposes of the present invention, the electrodes (cathode, anode) are selected in such a way that their potential matches as closely as possible the potential of the adjacent organic layer in order to ensure highly efficient electron or hole injection.

The cathode preferably comprises metal complexes, metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, can also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides, carbonates, etc. (for example LiF, $Li_2O$, $BaF_2$, MgO, NaF, CsF, $Cs_2O$, $Cs_2CO_3$, etc.). The layer thickness of this layer is preferably between 1 and 10 nm, particularly preferably between 2 and 8 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. For some applications, at least one of the electrodes must be transparent in order to facilitate either irradiation of the organic material (O-SCs) or the coupling-out of light (OLEDs/PLEDs, O-lasers). A preferred construction uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers, such as, for example, PEDOT or PANI.

The device is correspondingly structured in a manner known per se, depending on the application, provided with contacts and finally hermetically sealed, since the lifetime of such devices is drastically shortened in the presence of water and/or air.

The invention is explained in greater detail below with reference to some examples, which should not be taken to be restrictive of the scope of the invention.

WORKING EXAMPLES

In Examples 1 to 4, monomers which are preferred in accordance with the invention, or precursors thereof, are prepared. In Examples 5 to 7, polymers which are preferred in accordance with the invention and corresponding comparative polymers are prepared. In Examples 8 to 11, blends which are preferred in accordance with the invention are prepared.

A) Examples 1 to 4

Synthesis of the Monomers

Example 1

Preparation of 1-bromo-4-(3-ethoxypropyl)benzene 3

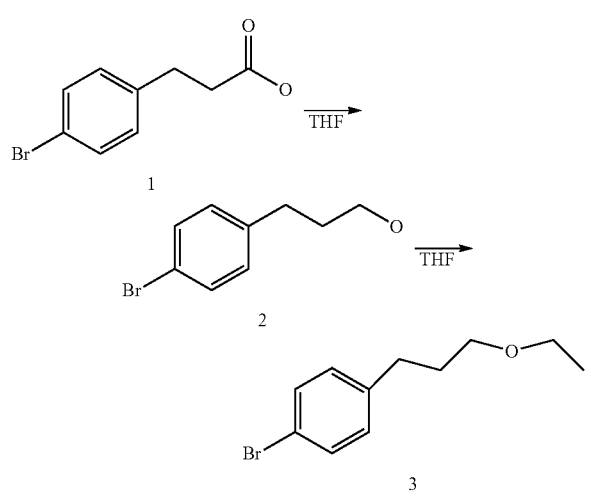

Step 1: 3-(4-Bromophenyl)propionic acid 1

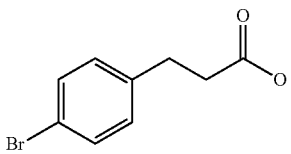

45.25 g (1 molar equivalent, 0.4 mol) of 2,2,4-trimethyl-2-oxazoline are initially introduced in 1000 ml of THF and cooled to −78° C. under a protective gas. A solution of 160 ml (1 molar equivalent, 0.4 mol) of 2.5 M n-butyllithium in hexane is slowly added dropwise. After 1 hour, 99.9 g (1 molar equivalent, 0.4 mol) of 4-bromobenzyl bromide, dissolved in 100 ml of THF, are slowly added dropwise. The solution is brought to room temperature overnight. The solution is concentrated to 200 ml, the organic phase is extracted with ether and 10% HCl solution, and the aqueous phase is neutralised using 40% NaOH solution and then likewise extracted with ether. The organic phase is washed with sodium chloride solution, dried over sodium sulfate and evaporated in vacuo. The oil is warmed under reflux for 2 hours with 500 ml of 10% HCl and cooled overnight. The product 1 is filtered off with suction and washed with water. The yield is 76.4 g (83.4%).

$^1$H NMR (DMSO, δ (ppm), J (Hz)): 2.49-2.53 (m, 3H), 2.78 (t, 2H, J=7.57), 7.19 (d, 2H, J=8.42), 7.45 (d, 2H, J=8.25)

Step 2: 3-(4-Bromophenyl)propan-1-ol 2

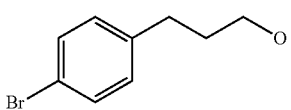

75 g (1 molar equivalent, 0.327 mol) of 1 are dissolved in 1000 ml of THF and cooled to 0° C. 150 ml of borane-methyl sulfide complex (4.83 molar equivalents, 1.582 mol) are then slowly added dropwise, and the mixture is subsequently stirred at 0° C. for 1 hour. The mixture is allowed to warm to room temperature overnight. Next day, the mixture is again cooled to 0° C., and 500 ml of methanol are carefully added. The mixture is subsequently allowed to warm slowly to room temperature and is stirred for a further 1 hour.

The batch is evaporated under reduced pressure, dissolved in 500 ml of diethyl ether, washed with 10% NaOH, washed with saturated NaCl solution, dried over sodium sulfate and re-evaporated under reduced pressure, leaving a yellow oil 2 in a yield of 69.62 g (98.9%).

$^1$H NMR (CDCl$_3$, δ (ppm), J (Hz)): 1.80-1.86 (m, 2H), 2.63 (t, 2H, 7.91), 2.23 (s, 1H), 3.60-3.63 (m, 2H), 7.04 (d, 2H, J=8.41), 7.37 (d, 2H, J=8.42)

Step 3: p-Bromo-tert-butylbenzene (1-bromo-4-(3-ethoxypropyl)benzene) 3

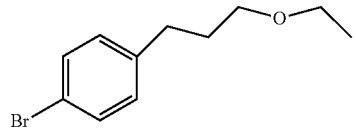

3

24.7 g (2 molar equivalents, 0.617 mol) of 60% sodium hydride dispersion are initially introduced, and 65 g (1 molar equivalent, 0.302 mol) of oil 2 are added with the aid of 100 ml of heptane. 500 ml of dried THF are subsequently added, and the mixture is cooled to 0° C. A mixture of alcohol (65 g) and 200 ml of THF is added, and the mixture is stirred for 1 hour. 39 ml (1.613 molar equivalents, 0.488 mol) of iodoethane are diluted with 150 ml of THF and carefully added dropwise. The batch is warmed to room temperature overnight, and the course of the reaction is followed by thin-layer chromatography (eluent: DCM/heptane 1:1). Cold water is then carefully added dropwise, and the mixture is stirred for a further 30 minutes. The phases are separated, with the water phase being separated off and washed with dichloromethane. The organic phase is extracted with water, dried over sodium sulfate, filtered and evaporated under reduced pressure, leaving a yellow oil 3 in a yield of 71.4 g (97.6%).

$^1$H NMR (CDCl$_3$, δ (ppm), J (Hz)): 1.20 (t, 3H, J=7.07), 1.83-1.89 (m, 2H), 2.65 (t, 2H, J=7.91), 3.40 (t, 2H, J=6.4), 3.46 (q, 2H, J=7.07), 7.06 (d, 2H, J=8.25), 7.39 (d, 2H, J=8.41)

Example 2

Preparation of 1-bromo-4-(butyl benzyl alcohol) 4

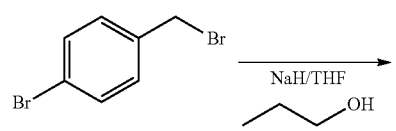

Step 1: 1-Bromo-4-(butyl benzyl alcohol)

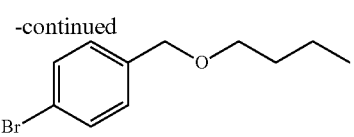

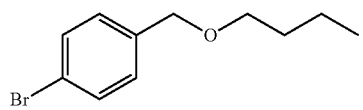

4

60% sodium hydride as a dispersion in oil is initially introduced in a well-dried four-necked flask, and 600 ml of abs. THF are added under argon. The reaction mixture is cooled to 0° C., and a solution of n-butanol in 150 ml of THF is slowly added dropwise at such a rate that the temperature does not exceed 3° C. p-Bromobenzyl bromide is dissolved in 250 ml of THF and subsequently slowly added dropwise at such a rate that the temperature does not exceed 5° C. The reaction mixture is slowly warmed to room temperature, and stirring is continued overnight at room temperature. Cold water is carefully added dropwise, and the mixture is stirred for a further 30 minutes. The phases are separated. The water phase is washed with dichloromethane. The organic phase is extracted with water, dried over sodium sulfate, filtered, and the solvent is removed under reduced pressure. The oil obtained is distilled in vacuo (76 to 78° C. at 0.13 mbar).

$^1$H NMR (CDCl$_3$, δ (ppm): 7.47 (d, 2H, J=8.13); 7.19 (d, 2H, J=8.18); 4.42 (s, 2H); 3.46 (t, 2H, J=7.11); 1.60 (m, 2H, J=7.07); 1.38 (m, 2H, J=7.21); 0.92 (t, 3H, J=7.18)

Example 3

Preparation of 2,8-dibromo-6,6-bis-(4-(3-ethoxypropyl)phenyl)-12,12-dioctyl-6,12-dihydroindeno[1,2-b]fluorene 8

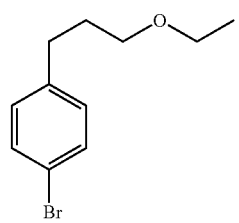

3

+

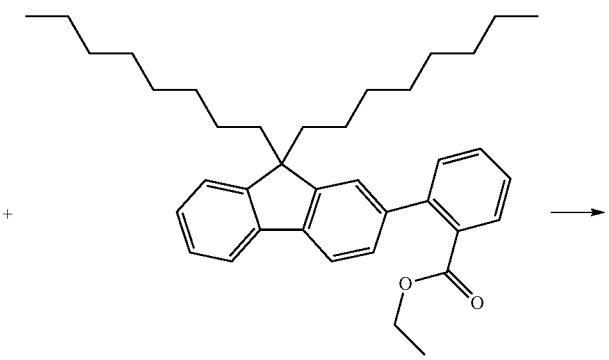

5

-continued
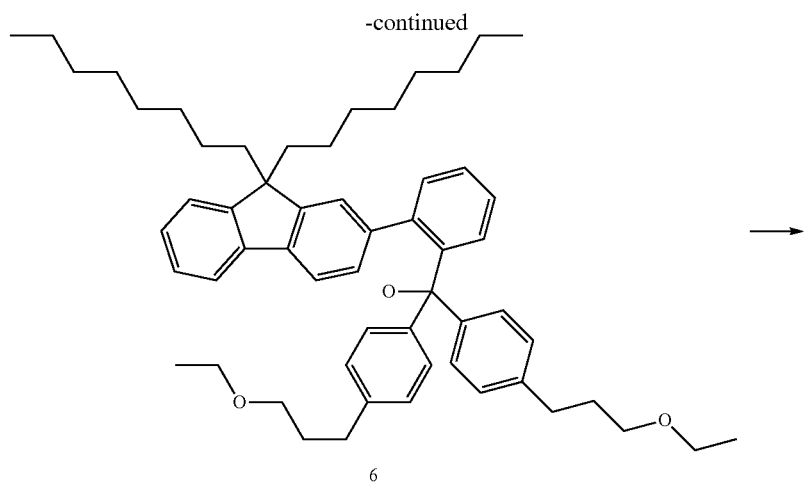
6
7
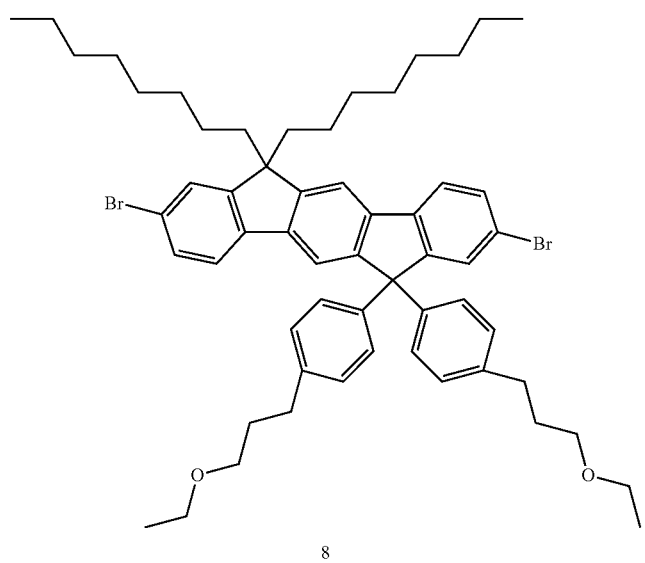 [SMILES: CCCCCCCCC1(CCCCCCCC)c2cc(Br)ccc2-c2cc3c(cc21)-c1ccc(Br)cc1C3(c1ccc(CCCOCC)cc1)c1ccc(CCCOCC)cc1]
8

Step 1: (2-(9,9-Dioctyl-9H-fluoren-2-yl)phenyl)bis-(4-(3-ethoxypropyl)-phenyl)methanol 6

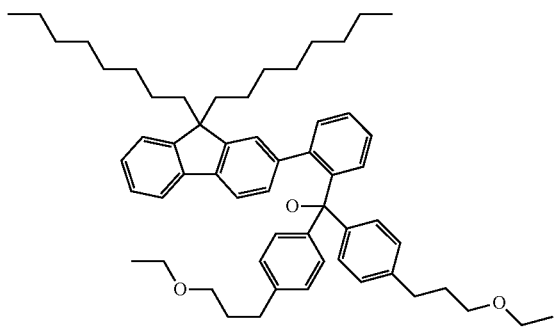

18.5 g (2 molar equivalents, 0.076 mol) of p-bromo-tert-butylbenzene 3 are initially introduced in 110 ml of THF and cooled to −67° C. in an acetone/dry-ice bath. 34 ml (2.2 molar equivalents, 0.085 mol) of 2.5 M n-butyllithium in hexane are added dropwise at such a rate that the internal temperature does not exceed −65° C., and stirring is subsequently continued at −72° C. for 2 hours. 19.9 g (1 molar equivalent, 0.037 mol) of phenyldioctylfluorene 5 are then dissolved in 20 ml of THF and slowly added dropwise at −66° C. The reaction solution is stirred at −70° C. for a further hour and at room temperature overnight. 15 ml of 50% acetic acid are added to the batch. The phases are separated. The aqueous phase is extracted with heptane. The combined organic phases are extracted with $H_2O$, dried over sodium sulfate, filtered and evaporated under reduced pressure.

Purification is carried out by column chromatography using the eluent heptane/ethyl acetate 1:1 and gives a yellow oil 6 in a yield of 14.5 g (48.2%).

$^1$H NMR (TCE, δ (ppm), J (Hz)): 0.51 (s broad, 4H), 0.80 (t, 6H, J=7.23), 0.91-1.21 (m, 26H), 1.47-1.65 (m, 2H), 1.75 (s broad, 2H), 1.84-1.94 (m, 4H), 2.69 (s broad, 4H), 3.13 (s, 1H), 3.40-3.49 (m, 8H), 6.77 (d, 1H, J=7.91), 6.81 (s, 1H), 6.93 (d, 1H, J=7.75), 7.03-7.16 (m, 8H), 7.19 (t, 2H, J=7.99), 7.26-7.32 (m, 4H), 7.53 (d, 1H, J=7.74), 7.65 (d, 1H, J=6.73)

Step 2: 6,6-Bis-(4-(3-ethoxypropyl)phenyl)-12,12-dioctyl-6,12-dihydroindeno[1,2-b]fluorene 7

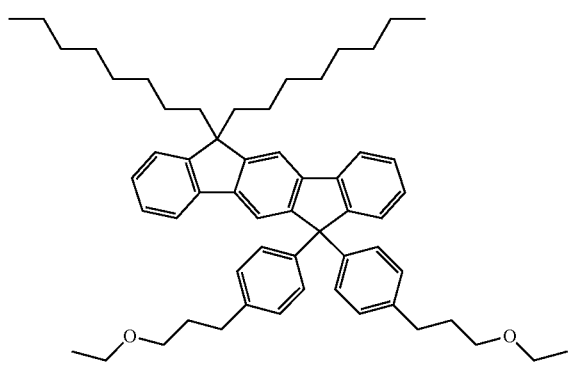

14.49 g (1 molar equivalent, 0.018 mol) of 6 are dissolved in 34 ml (33.8 molar equivalents, 0.594 mol) of acetic acid and warmed to reflux. 0.9 ml (0.4 molar equivalent, 0.007 mol) of concentrated hydrochloric acid is added under reflux, and the mixture is heated under reflux for 1.5 hours. After a TLC check (heptane/ethyl acetate), 2×2 ml of concentrated hydrochloric acid are subsequently metered in, reaction time 3 hours. When the reaction is complete, 25 ml of water are carefully added. A further 50 ml of water are subsequently added for phase separation. The mixture is extracted with dichloromethane, and the combined organic phases are then extracted with water and sodium hydrogencarbonate, dried over sodium sulfate, filtered and evaporated under reduced pressure.

Purification is carried out by column chromatography (heptane/ethyl acetate) and gives a red-brown oil 7 in a yield of 12.0 g (85.2%).

$^1$H NMR (CDCl$_3$, δ (ppm), J (Hz)): 0.64-0.76 (m, 4H), 0.80 (t, 6H, J=7.23), 1.06-1.20 (m, 26H), 1.83-1.89 (m, 4H), 2.00 (t, 4H, J=8.25), 2.63 (t, 4H, J=7.91), 3.40-3.47 (qt, 8H, J$_q$=7.07, J$_t$=6.56), 7.04 (d, 4H, J=8.42), 7.15 (d, 4H, J=8.42), 7.22-7.27 (m, 3H), 7.31-7.32 (m, 1H), 7.35 (t, 1H, J=7.48), 7.40 (d, 1H, J=7.57), 7.59-7.61 (m, 1H), 7.67 (d, 2H, J=6.22), 7.79 (d, 1H, J=7.41)

Step 3: Preparation of 2,8-dibromo-6,6-bis-(4-(3-ethoxypropyl)phenyl)-12,12-dioctyl-6,12-dihydroindeno[1,2-b]fluorene 8

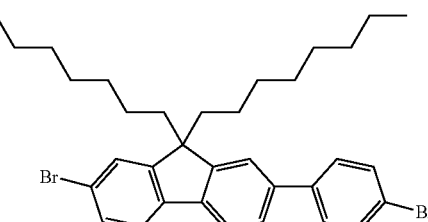
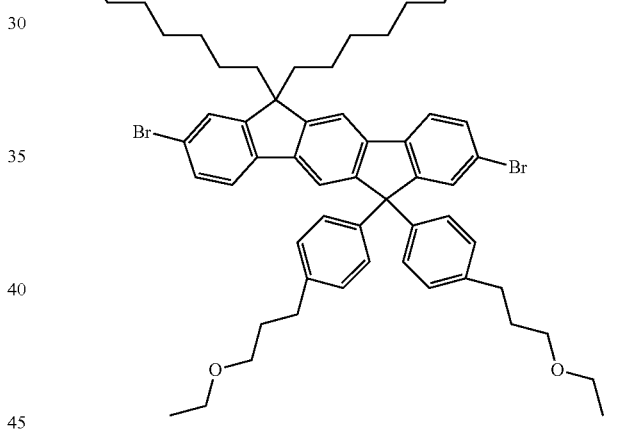

12.0 g (1 molar equivalent, 0.015 mol) of 7 are dissolved in 200 ml of dichloromethane and cooled to 2° C. A bromine solution comprising 1.5 ml of bromine (2 molar equivalents, 0.030 mol) in 20 ml of THF is slowly added dropwise (T<5° C.). The reaction solution is brought to room temperature overnight. After a HPLC check, two subsequent metered additions of bromine (150 microliters and 0.24 ml of 1 M solution in dichloromethane) are carried out at room temperature, the reaction time is in total 54 hours. 30 ml of sodium sulfate solution are carefully added, and 30 ml of water are subsequently added. The reaction solution is extracted with dichloromethane, and the solvent is removed under reduced pressure. Purification is carried out by column chromatography (heptane/ethyl acetate 1:1). The yellow oil obtained crystallises out after 5 days. Recrystallisation is carried out from acetonitrile/toluene and gives 8 in a yield of 6.8 g (47.4%).

$^1$H NMR (TCE, δ (ppm), J (Hz)): 0.71 (s, 4H), 0.80 (t, 6H, J=7.24), 1.02-1.20 (m, 26H), 1.82-1.88 (m, 4H), 1.93-2.00 (m, 4H), 2.62 (t, 4H, J=7.91), 3.39-3.46 (m, 8H), 7.08 (q, 8H, J=8.42), 7.41 (d, 1H, 8.08), 7.46 (s, 1H), 7.50 (q, 3H, J=7.74), 7.61 (s, 1H), 7.65 (s, 1H), 7.70 (d, 1H, J=8.08)

Example 4
Preparation of 2,8-dibromo-6,6-bis-(1-bromo-4-(butyl benzyl alcohol)-12,12-dioctyl-6,12-dihydrodibenzoindeno[1,2-b]fluorene 12
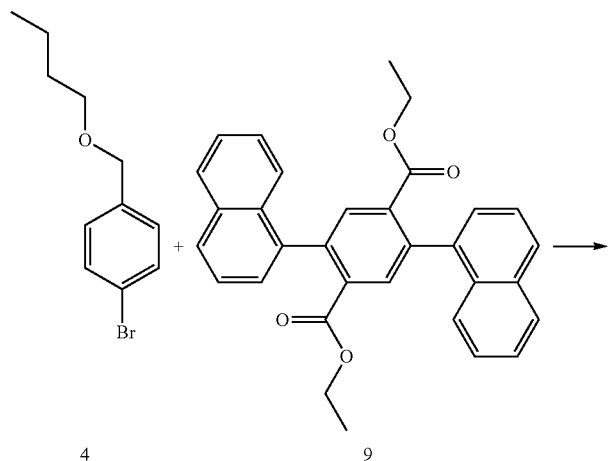
4      9
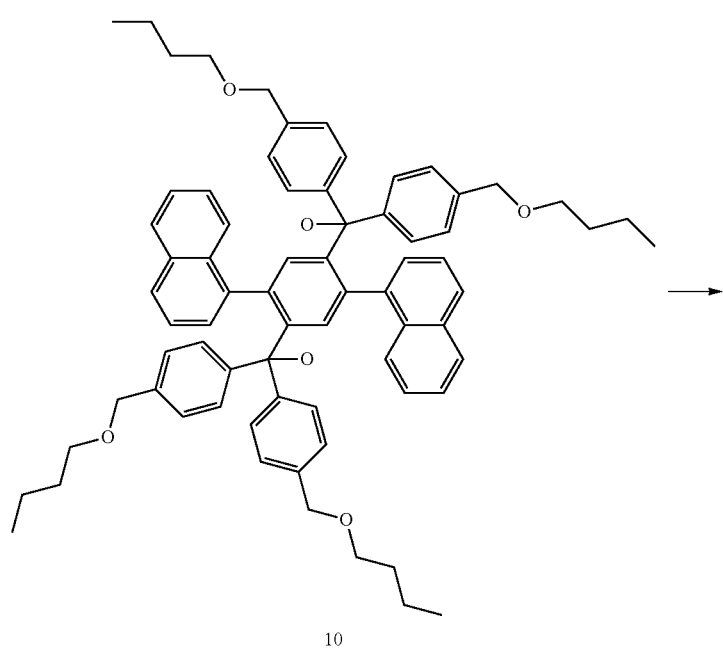
10

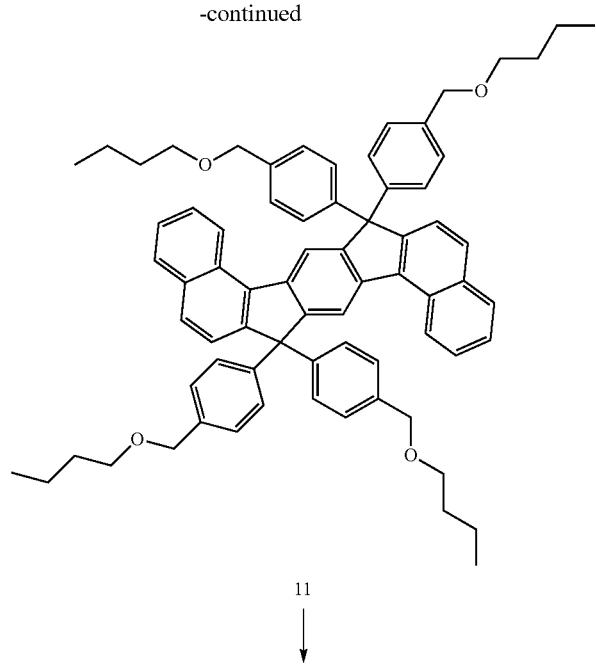
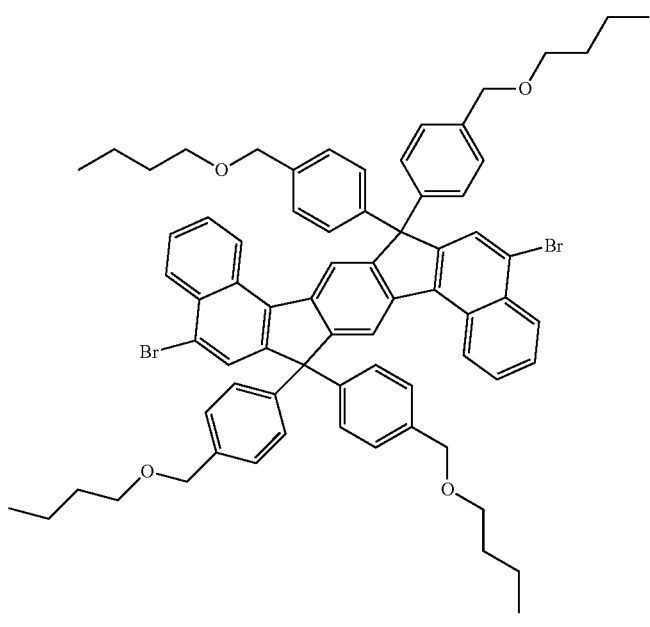

Step 1: (2-(9,9-Dioctyl-9H-fluoren-2-yl)phenyl)bis-(4-(3-ethoxypropyl)-phenyl)methanol 10

Step 2: 6,6-Bis-(4-benzyl butyl ether)-12,12-dioctyl-6,12-dihydrodibenzoindeno[1,2-b]fluorene 11

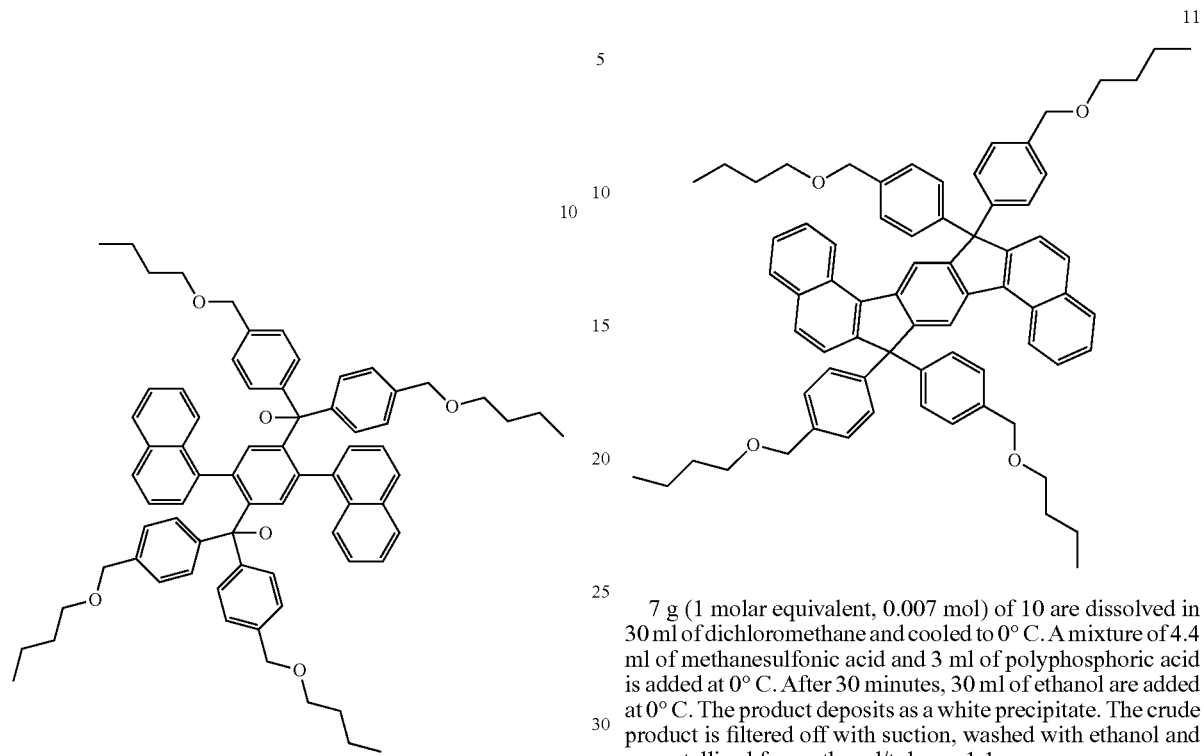

7 g (1 molar equivalent, 0.007 mol) of 10 are dissolved in 30 ml of dichloromethane and cooled to 0° C. A mixture of 4.4 ml of methanesulfonic acid and 3 ml of polyphosphoric acid is added at 0° C. After 30 minutes, 30 ml of ethanol are added at 0° C. The product deposits as a white precipitate. The crude product is filtered off with suction, washed with ethanol and recrystallised from ethanol/toluene 1:1.

$^1$H NMR (CDCl$_3$, δ (ppm), J (Hz)): 0.86 (t 6H J=7.24), 0.94 (t, 6H, J=7.23), 1.26-1.65 (4*m, 16H), 3.31 (t, 4H J=7.21), 3.45 (t, 4H J=7.20), 4.32 (s, 4H), 4.48 (s, 4H), 6.96-7.05 (m, 2H), 7.12 (d, 2H, J=7.75), 7.19 (d, 2H, J=7.75), 7.42 (m, 8H), 7.50 (d, 2H, J=7.73) 7.72 (d, 2H, J=7.75), 7.90 (s, 2H), 8.58 (d, 2H, J=7.78)

23.05 g (4.5 molar equivalents, 0.095 mol) of p-bromobenzyl butyl ether 4 are initially introduced in 100 ml of THF and cooled to −75° C. in an acetone/dry-ice bath. 42 ml (5 molar equivalents, 0.105 mol) of 2.5 M n-butyllithium in hexane are added dropwise at such a rate that the internal temperature does not exceed −65° C., and the mixture is subsequently stirred at −75° C. for a further 1 hour. 10 g (1 molar equivalent, 0.021 mol) of ethyl dinaphthyl-terephthalate 9 are then dissolved in 150 ml of THF and slowly added dropwise at −75° C. The reaction solution is stirred at −75° C. for a further hour and at room temperature overnight. 15 ml of 50% acetic acid are added to the batch. The phases are separated. The aqueous phase is extracted with heptane. The combined organic phases are extracted with H$_2$O, dried over sodium sulfate, filtered and evaporated under reduced pressure.

Purification is carried out by recrystallisation from n-heptane, giving 7.3 g of white crystals.

$^1$H NMR (CDCl$_3$, δ (ppm), J (Hz)): 0.86 (t 6H J=7.24), 0.94 (t, 6H, J=7.23), 1.26-1.65 (4*m, 16H), 3.31 (t, 4H J=7.21), 3.45 (t, 4H J=7.20), 4.32 (s, 4H), 4.48 (s, 4H) 6.77 (d, 2H, J=7.91), 6.88 (s, 2H), 6.96-7.05 (m, 2H), 7.12 (d, 2H, J=7.75), 7.19 (d, 2H, J=7.75), 7.42 (m, 8H), 7.50 (d, 2H, J=7.73) 7.72 (d, 2H, J=7.75) 7.78 (d, 2H, J=7.78)

Step 3: Preparation of 2,8-dibromo-6,6-bis-(4-benzyl butyl ether)-12,12-dioctyl-6,12-dihydrodibenzoindeno[1,2-b]fluorene 12

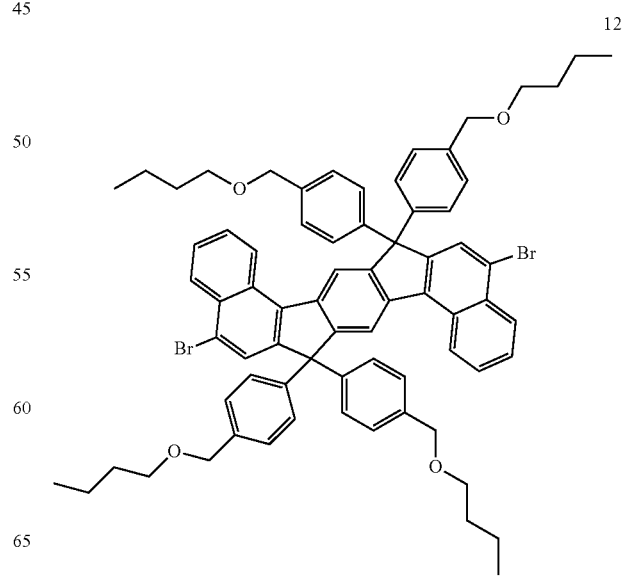

5 g (1 molar equivalent, 0.005 mol) of 11 are dissolved in 80 ml of dichloromethane and cooled to 2° C. 2 molar equivalents (0.010 mol) of N-bromosuccinimide are subsequently added, and the reaction mixture is stirred overnight at room temperature. The reaction is terminated by the addition of 15 ml of 10% sodium sulfite solution. The reaction solution is extracted with dichloromethane, and the solvent is removed under reduced pressure. Recrystallisation is carried out from ethanol and gives 12 in a yield of 5 g (80%).

$^1$H NMR (CDCl$_3$, δ (ppm), J (Hz)): 0.89 (t, 12H, J=7.24), 1.37 (m, 8H, J=7.22), 1.55 (m, 8H, J=7.22), 3.43 (t, 8H, J=7.91), 4.45 (s, 8H), 7.26 (d, 8H, J=8.42), 7.31 (d, 8H, 8.41), 7.64 (m, 4H), 7.82 (s, 2H), 8.33 (d, 2H, J=8.06), 8.34 (s, 2H) 8.56 (d, 2H, J=8.08)

B) Examples 5 to 7

Synthesis of the Polymers

Polymers P1 to P3, which comprise monomers of the following compositions, are synthesised by SUZUKI coupling in accordance with WO 03/048225. The percentage proportions of the monomers in the polymer are given, with negligible deviations, in the amount specification of the monomers, where the bromine or boronic acid substituents then represent a bond to a further structural unit.

Example 5

Polymer P1

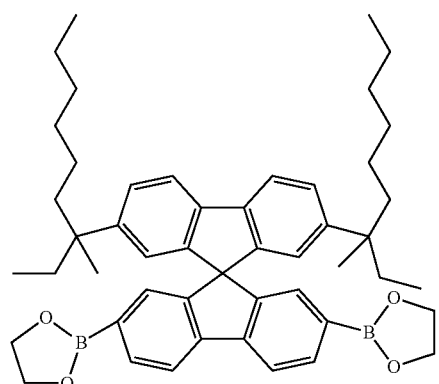

50%

+

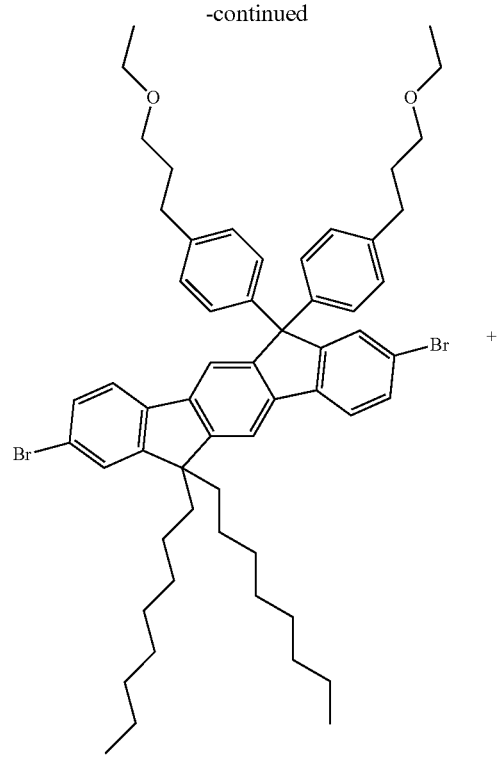

46%

+

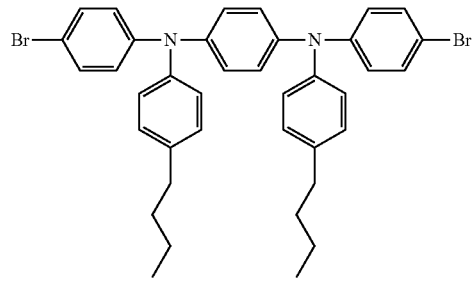

2%

+

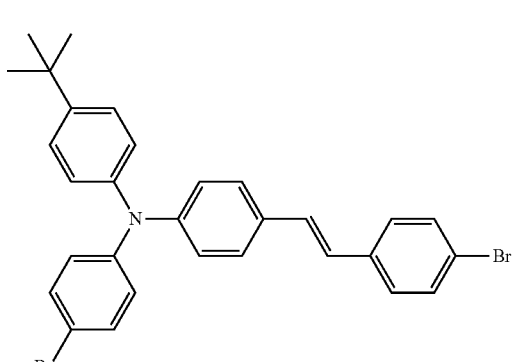

2%

Example 6
Polymer P2
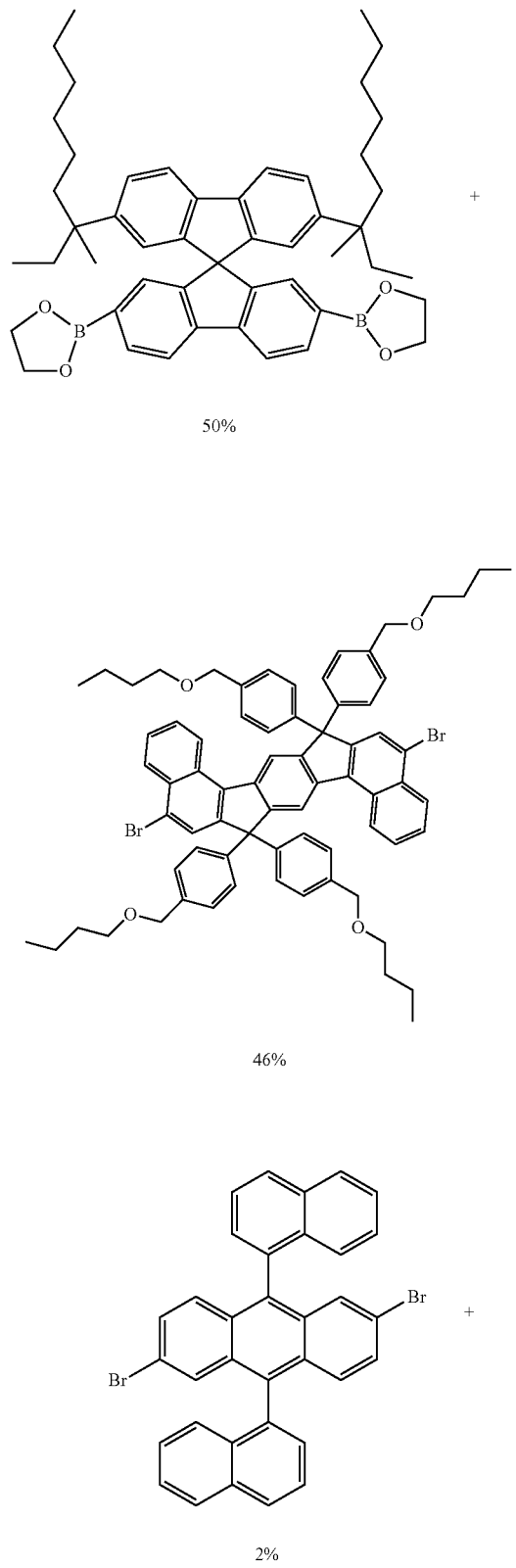
50%
46%
2%
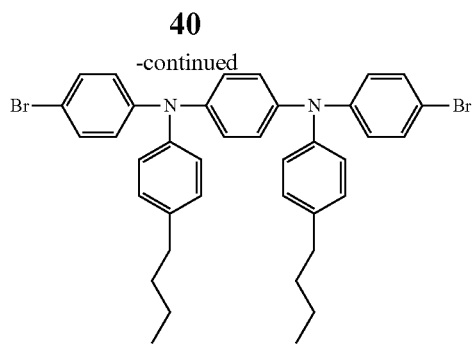
2%
Example 7
Polymer P3
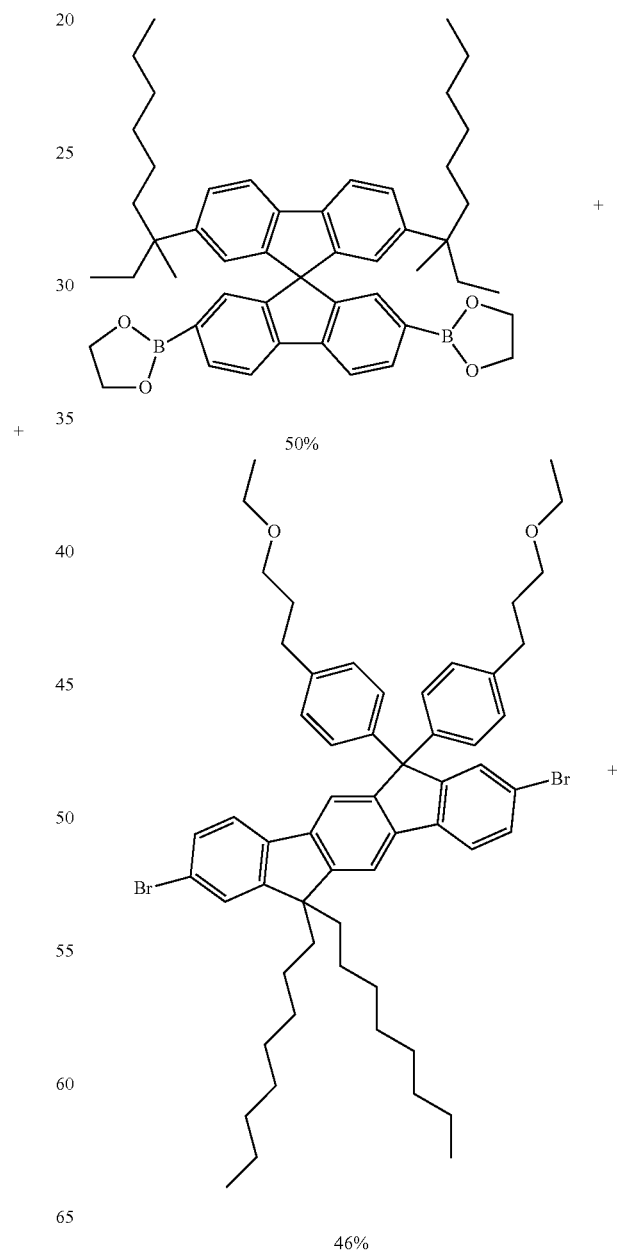
50%
46%

41
-continued
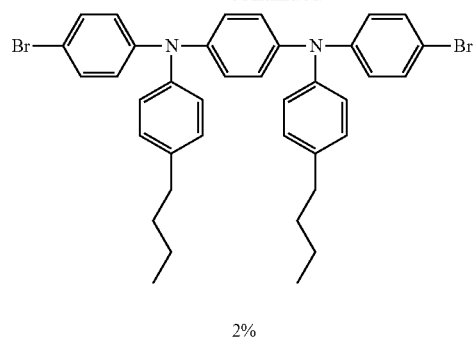
2%
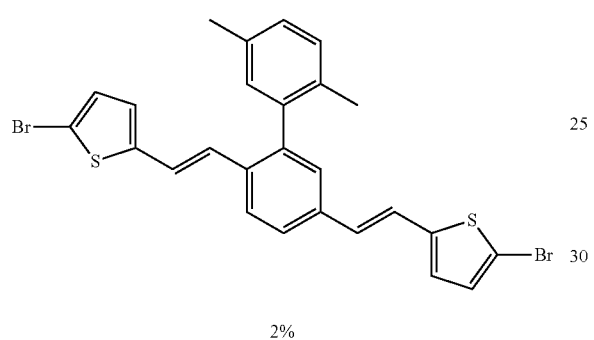
2%
Comparative Polymers:
Comparative Polymer C1:
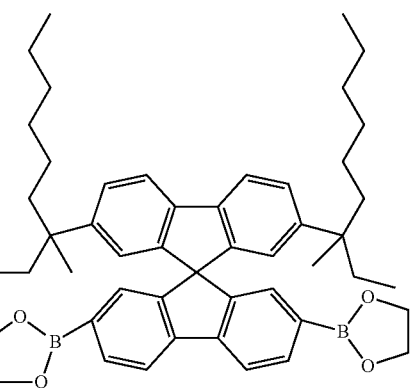
50%
42
-continued
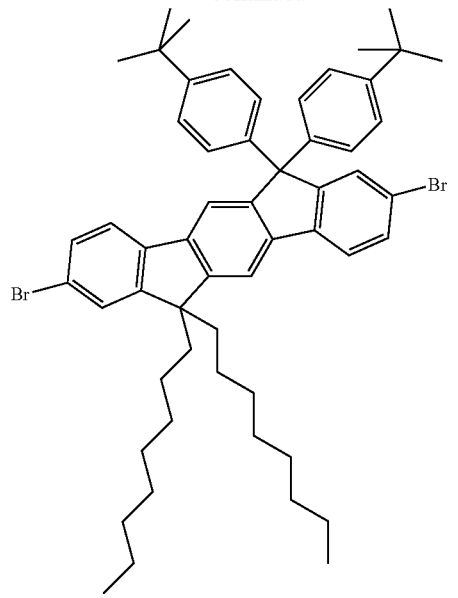
46%
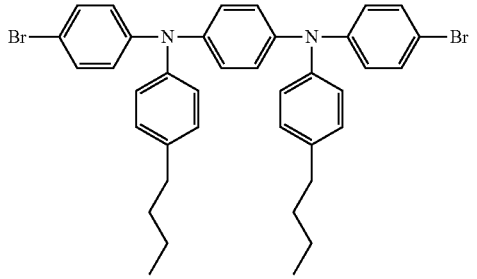
2%
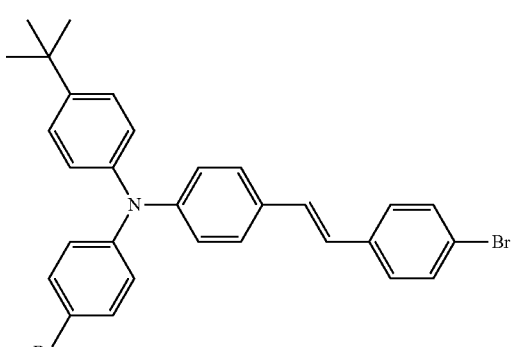
2%

Comparative Polymer C2:
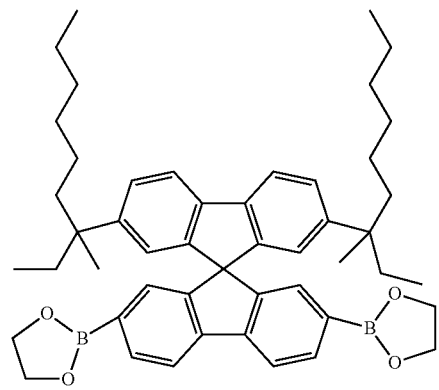
50%
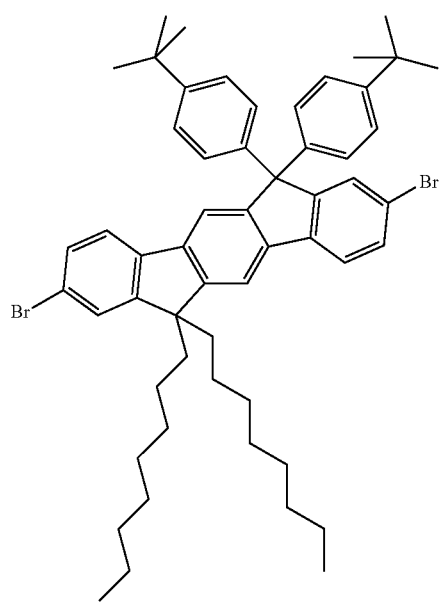
46%
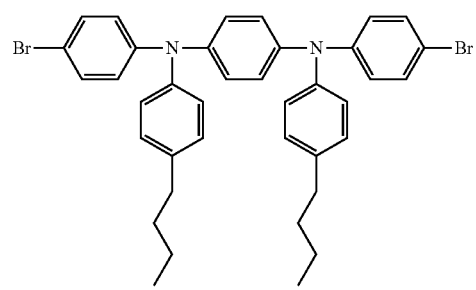
2%
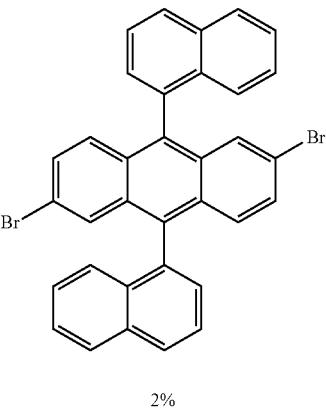
2%
Comparative Polymer C3:
50%
46%

-continued

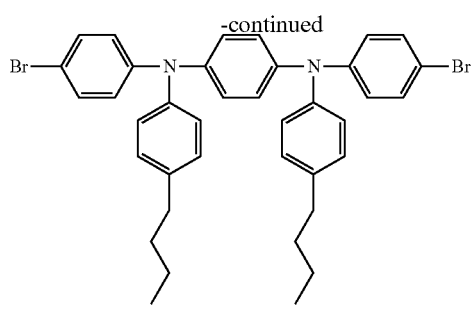

2%

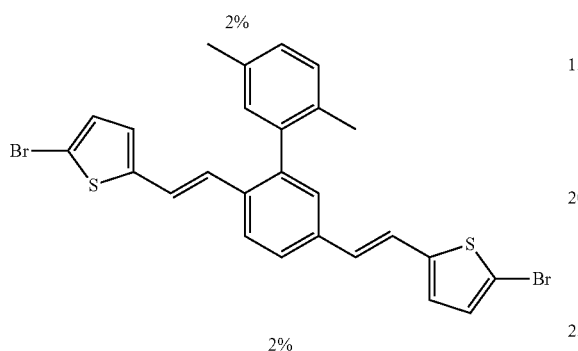

2%

The production of a polymeric OLED (PLED) has already been described a number of times in the patent literature (see, for example, WO 04/037887). In order to explain the present invention by way of example, PLEDs comprising polymers P1 to P3 and comparative polymers C1 to C3 are produced by spin-coating onto an ITO substrate which has been coated in advance with PEDOT and a hole-injecting interlayer (PEDOT is a polythiophene derivative (Baytron P from H. C. Starck, Goslar)). The layer thickness of the polymer layer is about 65 nm. A Ba/Al cathode (metals from Aldrich) is then applied by vapour deposition, and the PLED is encapsulated and characterised electro-optically.

The results for polymers P1 to P3 according to the invention and comparative polymers C1 to C3 are given in Table 1 below.

TABLE 1

| Ex. | Polymer | Max. eff. [cd/A] | U@100 cd/m² [V] | CIE [x/y] | Lifetime [h] |
|---|---|---|---|---|---|
| 5 | P1 | 6.4 | 3.4 | 0.15/0.17 | 1200@1000 |
| 5 | C1 | 5.9 | 5.3 | 0.15/0.18 | 600@1000 |
| 6 | P2 | 5.52 | 3.9 | 0.14/0.21 | 950@1000 |
| 6 | C2 | 5.43 | 6.1 | 0.14/0.21 | 350@1000 |
| 7 | P3 | 17.38 | 2.9 | 0.32/0.60 | 13000@1000 |
| 7 | C3 | 14.20 | 5.4 | 0.29/0.60 | 7700@1000 |

C) Examples 8 to 11

Preparation of Blends

The blends according to the invention are prepared by the following general process:
1. For each component, a solution of the same concentration is prepared. To this end, a corresponding amount of the solid compound is weighed out and added to the corresponding amount of a suitable solvent. The mixture is then stirred for at least 1 hour until a clear solution has formed.
2. For the preparation of the blend, the corresponding volumes of the solution are taken using a pipette and combined in a fresh vessel. For example, for the preparation of 10 ml of blend comprising 50% of component A, 25% of component B and 25% of component C, volumes of 5 ml of component A (5 g/l), 2.5 ml of component B (5 g/l) and 2.5 ml of component C (5 g/l) are taken and combined. Toluene, for example, can serve as solvent.

The following polymers P4 and P5 are prepared for a blend according to the invention. Polymers P4 and P5 are synthesised by SUZUKI coupling of the corresponding monomers in accordance with WO 03/048225. The percent data relate to the proportions of the structural units in the respective polymer.

Example 8

Blend of Polymers P4 and P5

Polymer P4:

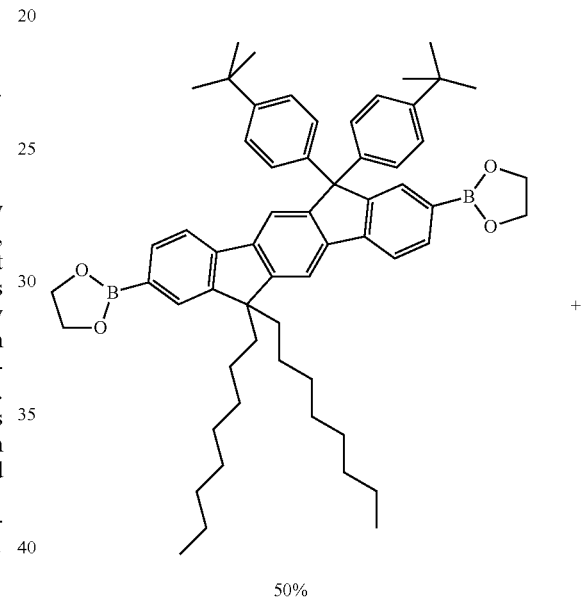

50%

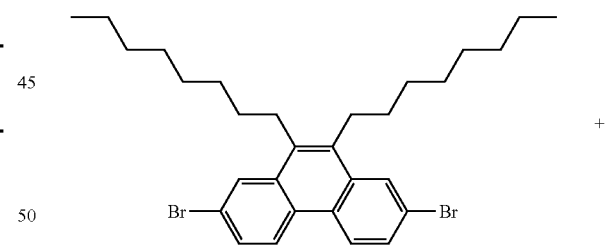

46.4%

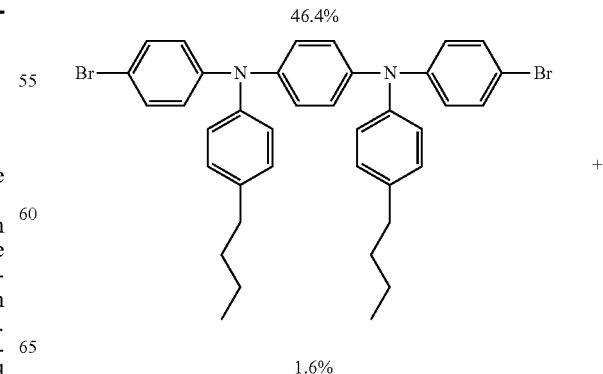

1.6%

-continued

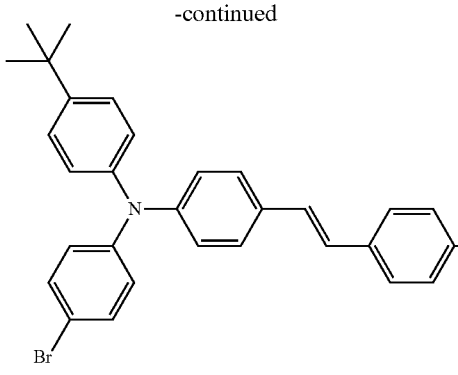

2%

Polymer P5:

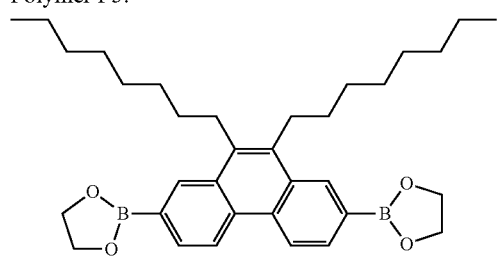

50%

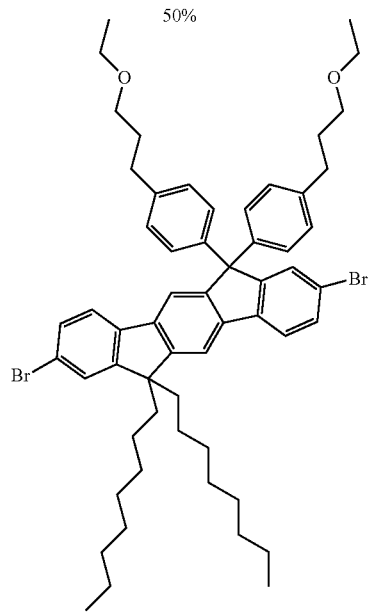

48%

2%

A 2-component blend of polymers P4 and P5 in the ratio 1:1 is prepared in accordance with the procedure described above.

On checking the OLEDs (Table 2), it is surprisingly found that the blend of P4 and P5 is clearly superior to the two individual polymers in efficiency and especially lifetime and at the same time has very low operating voltages.

TABLE 2

| Ex. | Polymer | Max. eff. [cd/A] | U@100 cd/m$^2$ [V] | CIE [x/y] | Lifetime [h] |
|---|---|---|---|---|---|
| 8 | P4 | 7.05 | 6.1 | 0.15/0.19 | 900@1000 |
| 8 | P5 | 3.49 | 3.9 | 0.14/0.17 | 350@1000 |
| 8 | P4 + P5 (50:50) | 7.28 | 4.1 | 0.15/0.19 | 1700@1000 |

P4 with no structural unit carrying alkylalkoxy groups and P5 with a structural unit carrying alkylalkoxy groups have an identical LUMO energy level of −2.2 eV (measured directly by cyclic voltammetry). The effect of the unit carrying alkylalkoxy groups is thus not a reduction in the LUMO level, but instead a completely new and hitherto unexplained mechanism which results in the increased efficiencies and lifetimes of the polymers or blends according to the invention.

Example 9

Blend of Polymers P6 and P7

Polymer P6:

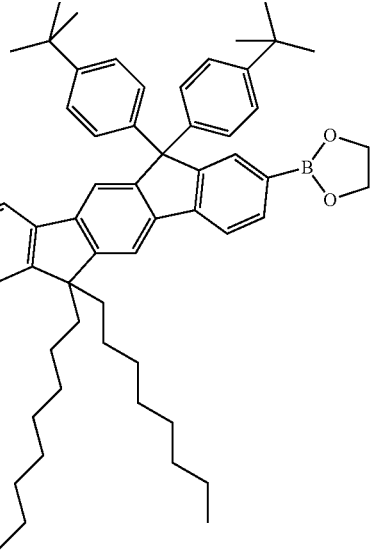

50%

-continued

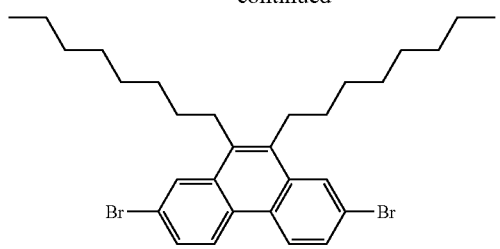

46.4%

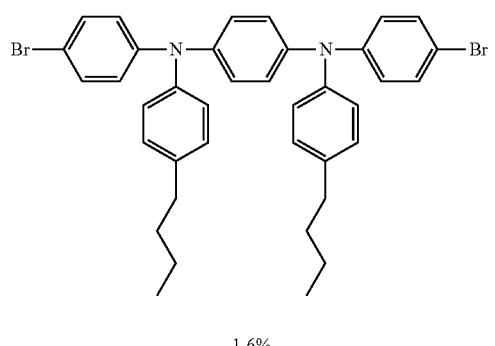

1.6%

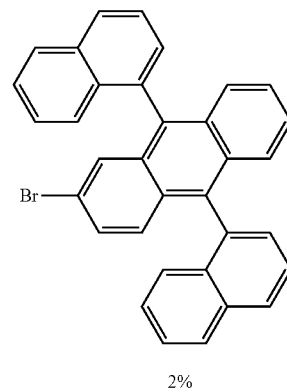

2%

Polymer P7:

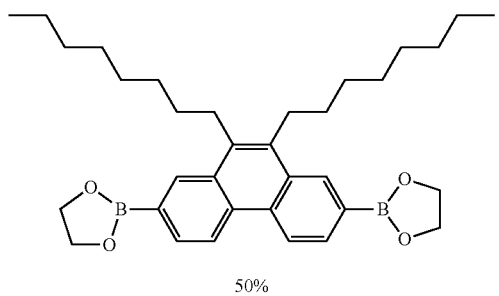

50%

+

-continued

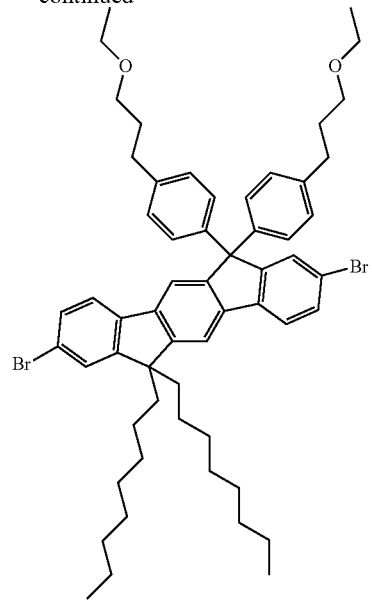

50%

A 2-component blend of polymers P6 and P7 in the ratio 1:1 is prepared in accordance with the procedure described above.

On checking the OLEDs (Table 3), it is surprisingly found that the blend of P6 and P7 is clearly superior to the two individual polymers in respect of the lifetime.

TABLE 3

| Ex. | Polymer | Max. eff. [cd/A] | U@100 cd/m² [V] | CIE [x/y] | Lifetime [h] |
|---|---|---|---|---|---|
| 9 | P6 | 6.01 | 6.2 | 0.14/0.21 | 1200@1000 |
| 9 | P7 | 1.00 | 4.3 | 0.15/0.08 | 30@1000 |
| 9 | P6 + P7 (50:50) | 5.63 | 5.0 | 0.14/0.21 | 2400@1000 |

Example 10

Blend of Polymers C3, P5 and P8

Comparative Polymer C3:

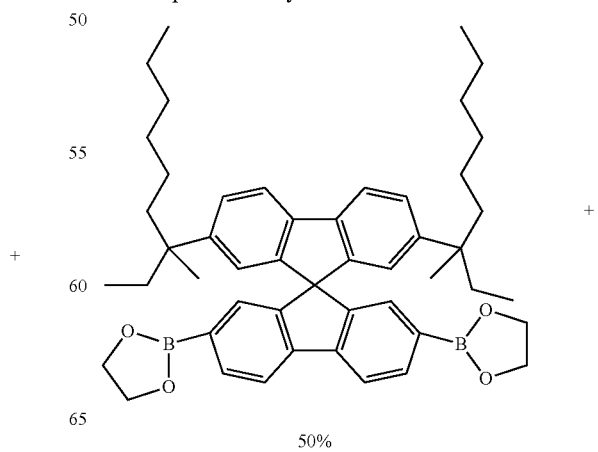

50%

51
-continued
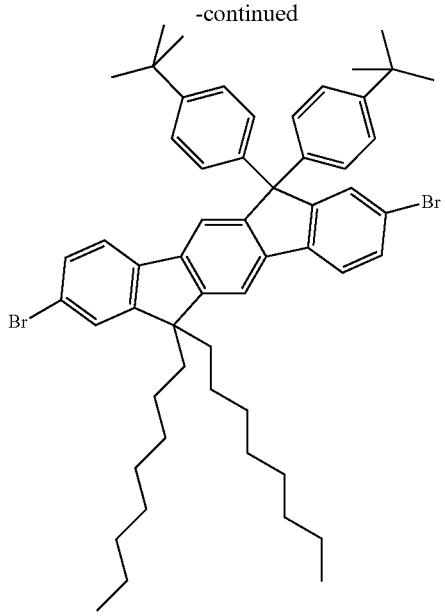
46%
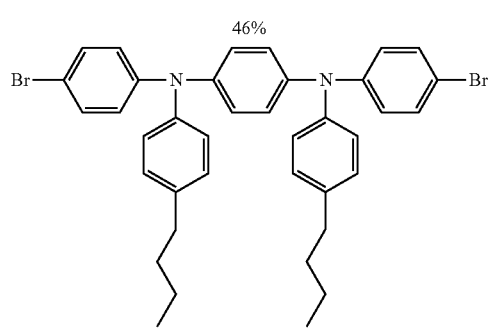
2%
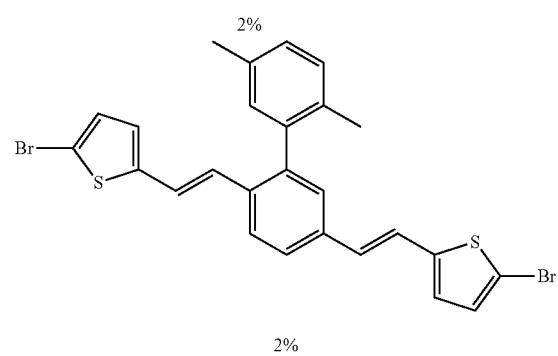
2%
(see above)
Polymer P5:
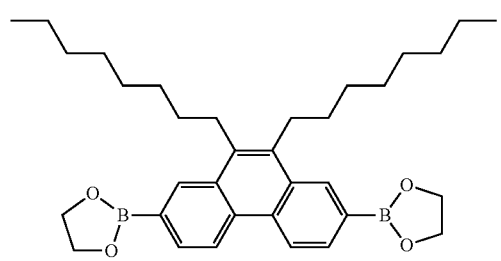
50%
52
-continued
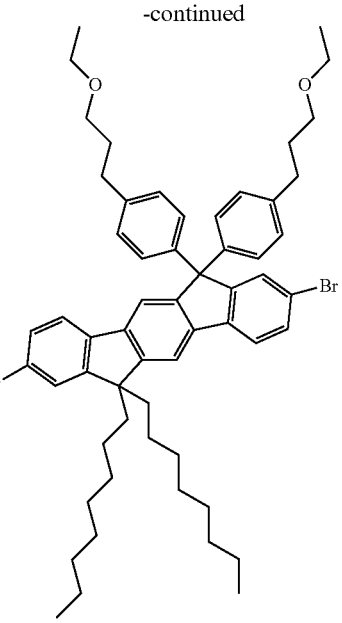
48%
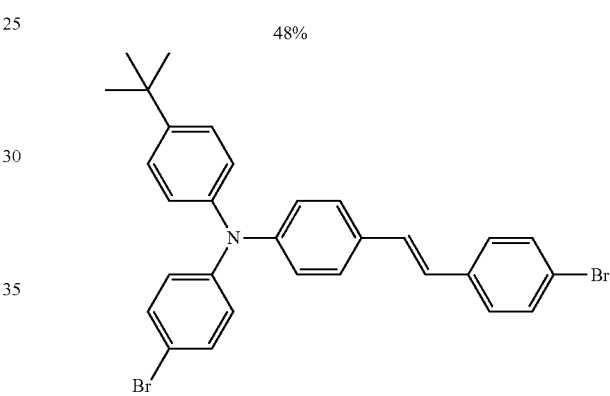
2%
(see above)
Polymer P8:
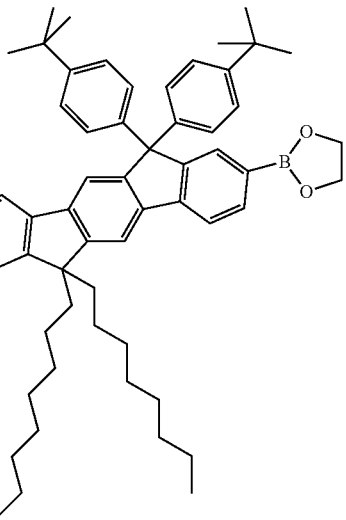
50%

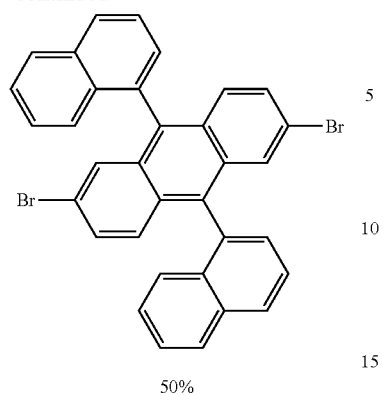

50%

On checking the OLEDs (Table 4), it is surprisingly found that the blend of C3, P5 and P8 is clearly superior to all individual polymers, in particular also P7, in efficiency and especially lifetime.

TABLE 4

| Ex. | Polymer | Max. eff. [cd/A] | U@100 cd/m² [V] | CIE [x/y] | Lifetime [h] |
|---|---|---|---|---|---|
| 10 | C3 | 14.20 | 5.4 | 0.29/0.60 | 7700@1000 |
| 10 | P5 | 3.49 | 3.9 | 0.14/0.17 | 350@1000 |
| 10 | P8 | 1.25 | 6.3 | 0.14/0.30 | 30@1000 |
| 10 | C3 + P5 + P8 (43% + 43% + 14%) | 15.75 | 3.1 | 0.29/0.57 | 13000@1000 |

Example 11

Blend of Polymers P9 to P12 Compared with the Corresponding Copolymer P13

The following polymers P9 to P13 are synthesised by SUZUKI coupling of the corresponding monomers in accordance with WO 03/048225. The percent data relate to the proportions of the structural units in the respective polymer.

Polymer P9:

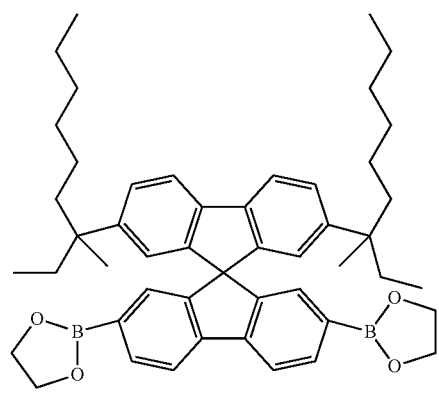

50%

Polymer P10:

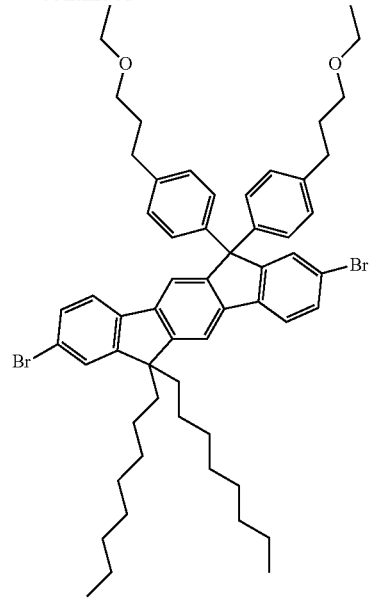

+

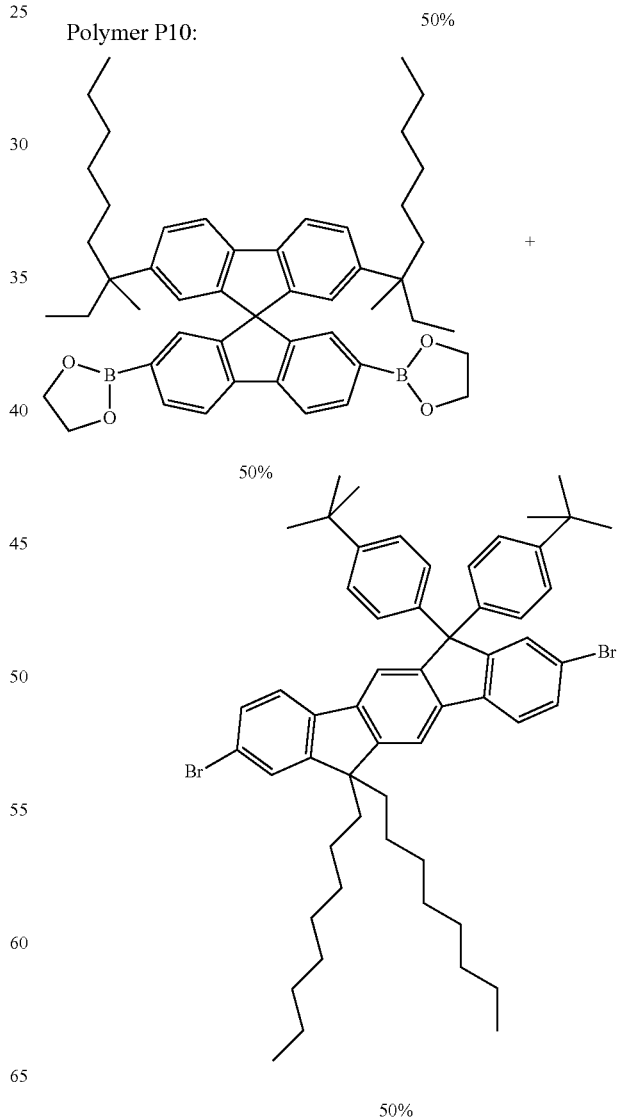

50%

Polymer P11:
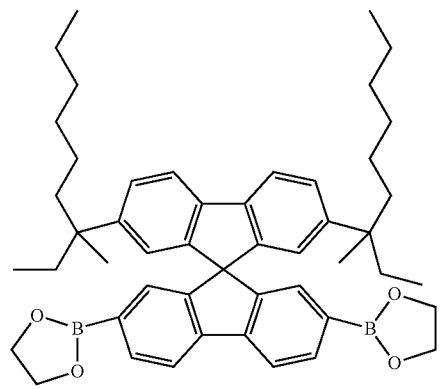
50%
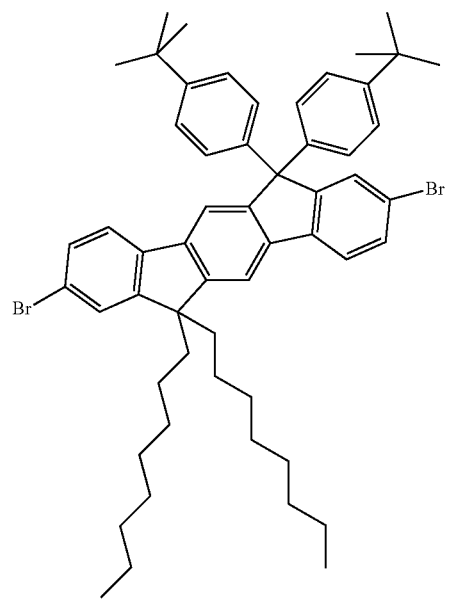
35%
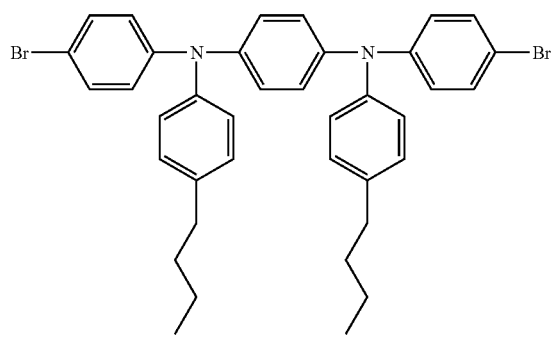
15%
Polymer P12:
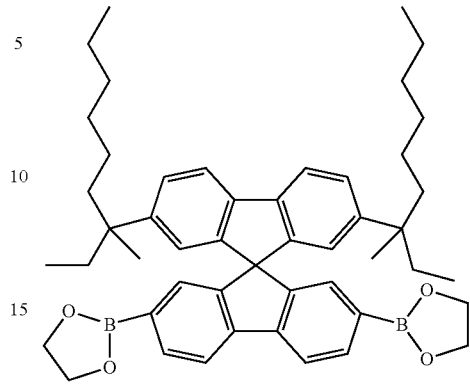
50%
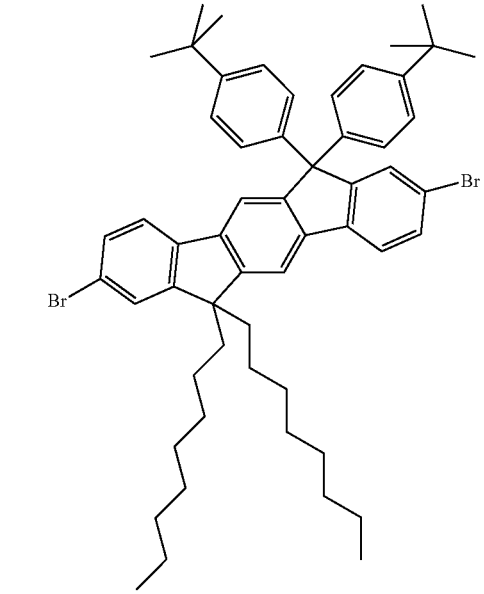
35%
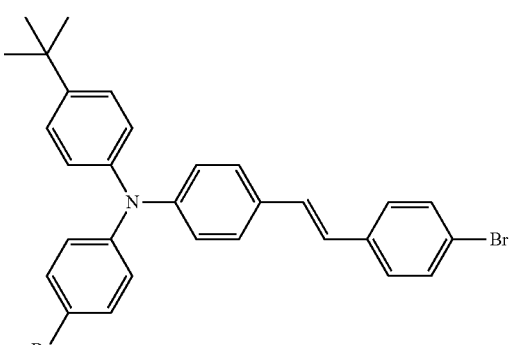
15%

Polymer P13:

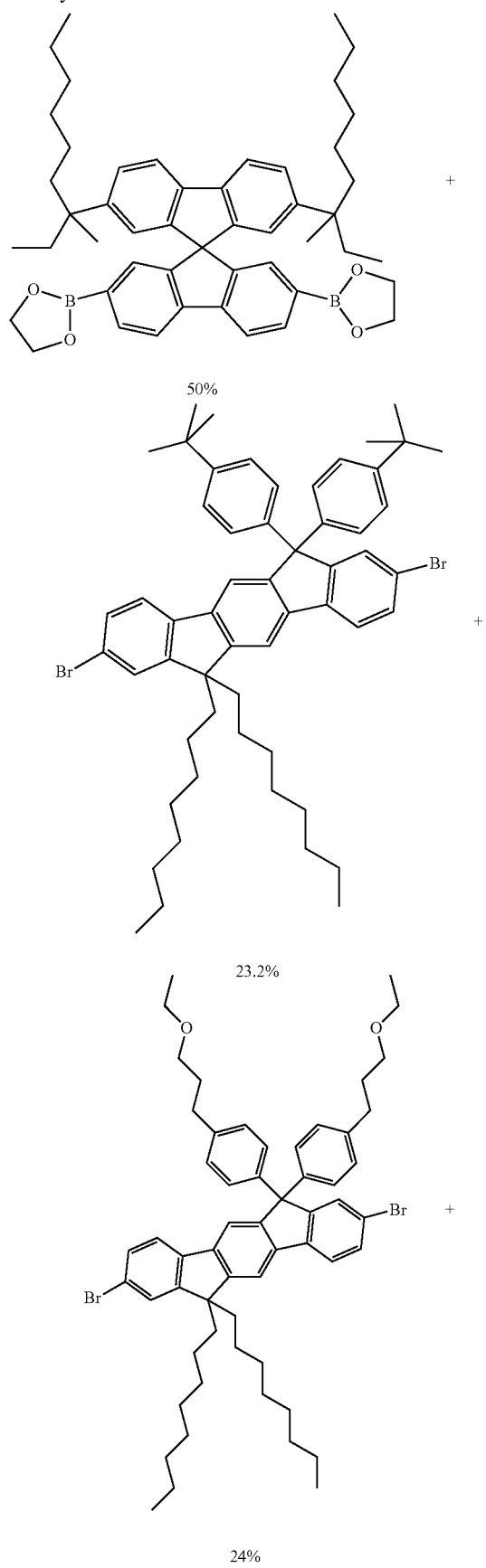

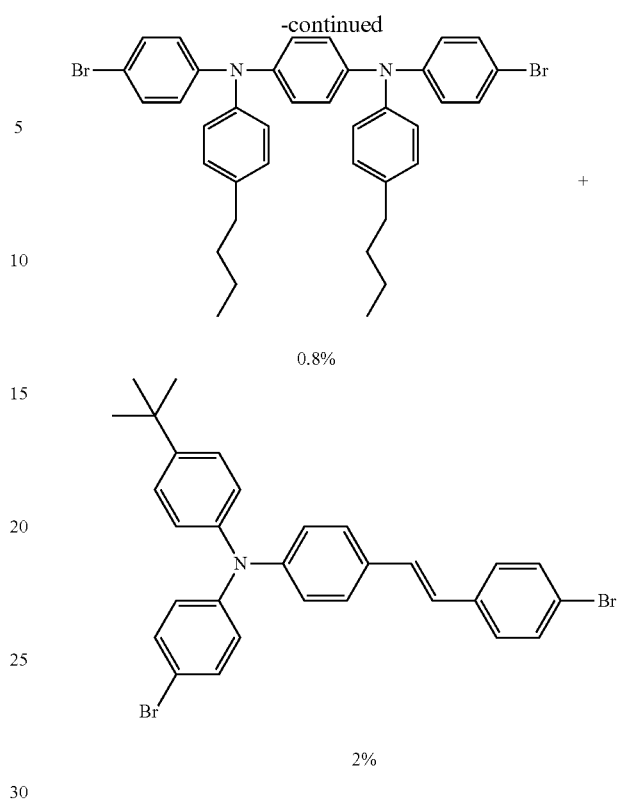

A blend is prepared from P9 (electron-injection component), P10 (filling component), P11 (hole-transport component) and P12 (emitter component). The proportions are selected so that the corresponding monomer concentrations of polymer P13 (random copolymer) are achieved.

On checking the OLEDs (Table 5), it is surprisingly found that the blend of P9 to P12
(a) is clearly superior to all four individual polymers in virtually all properties and
(b) is clearly superior to the random copolymer having the same overall composition (P13) in respect of the lifetime.

TABLE 5

| Ex. | Polymer | Max. eff. [cd/A] | U@100 cd/m$^2$ [V] | CIE [x/y] | Lifetime [h] |
|---|---|---|---|---|---|
| 11 | P9 | 0.94 | 4.4 | 0.15/0.08 | 20@1000 |
| 11 | P10 | 0.50 | 5.8 | 0.15/0.08 | 10@1000 |
| 11 | P11 | 3.75 | 5.6 | 0.16/0.22 | 90@1000 |
| 11 | P12 | 0.54 | 6.0 | 0.14/0.22 | 20@1000 |
| 11 | P13 | 5.16 | 4.8 | 0.15/0.19 | 600@1000 |
| 11 | Blend P9 + P10 + P11 + P12 | 5.99 | 4.8 | 0.15/0.19 | 1200@1000 |

The invention claimed is:

1. A polymer comprising, as structural unit Z, an aromatic or heteroaromatic ring system, where at least one H atom of said aromatic or heteroaromatic ring system is substituted by an alkylalkoxy group A which is bonded to said aromatic or heteroaromatic ring system via a C atom of the alkylalkoxy group and where said aromatic or heteroaromatic ring system is substituted by one or more substituents $R^1$ wherein
$R^1$ is in each case, independently of one another, a bond to a further structural unit or denotes H, D, F, Cl, Br, I, $N(R^2)_2$, $N(Ar)_2$, $C(=O)Ar$, $P(=O)Ar_2$, $S(=O)Ar$, S(=O)$_2$Ar, CR$^2$=CR$^2$Ar, CN, NO$_2$, Si(R$^2$)$_3$, B(OR$^2$)$_2$, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 40 aromatic ring atoms, which optionally in each case is substituted by one or more radicals R$^2$, or an aryloxy or heteroaryloxy group having 5 to 40 aromatic ring atoms, which is optionally substituted by one or more radicals R$^2$, or a combination of these systems; where, in addition, two or more substituents R optionally forms a mono- or polycyclic, aliphatic or aromatic ring system with one another, and R$^2$ is in each case, independently of one another, H or an aliphatic or aromatic hydrocarbon radical having 1 to 20 C atoms and wherein the alkylalkoxy group A is bonded to the aromatic or heteroaromatic ring system via an aromatic or heteroaromatic group Ar, and wherein the structural unit Z is selected from the group consisting of substituted or unsubstituted trans-indenofluorene, benzo-trans-indenofluorene, dibenzo-trans-indenofluorene, cis-indenofluorene, benzo-cis-indenofluorene, dibenzo-cis-indenofluorene, spirobifluorene, dihydrophenanthrene, phenanthrene, dibenzofuran, benzofluorene, benzochromene, dibenzooxepine and anthracene and wherein, the alkylalkoxy group A conforms to the formula —Ar$_n$—(CR$_2$)$_m$—O—(CR$_2$)$_o$—O$_x$—(CR$_2$)$_p$—CR$_3$, in which R can adopt, independently of one another, identically or differently, one of the meanings indicated for R$^1$ and in which individual CR$_2$ groups is optionally replaced by alkenyl, alkynyl, aryl or heteroaryl groups, n≥0, m>0, o≥0, x is 0 and p≥0.

2. The polymer according to claim 1, wherein the structural unit Z conforms to the general formula I

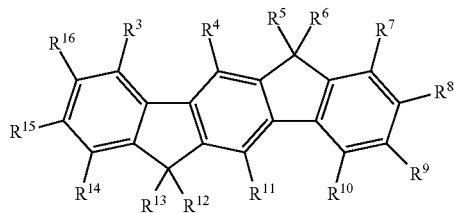

I where at least one of the radicals R$^3$ to R$^{16}$ denotes a bond to a further structural unit, at least one of the radicals R$^3$ to R$^{16}$ denotes a linear or branched alkylalkoxy group A, which is bonded to the compound of the general formula I via a C atom, and where the remaining radicals R$^3$ to R$^{16}$ in each case, independently of one another, a bond to a further structural unit or denotes H, D, F, Cl, Br, I, N(R$^2$)$_2$, N(Ar)$_2$, C(=O)Ar, P(=O)Ar$_2$, S(=O)Ar, S(=O)$_2$Ar, CR$^2$=CR$^2$Ar, CN, NO$_2$, Si(R$^2$)$_3$, B(OR$^2$)$_2$, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 40 aromatic ring atoms, which optionally in each case is substituted by one or more radicals R$^2$, or an aryloxy or heteroaryloxy group having 5 to 40 aromatic ring atoms, which is optionally substituted by one or more radicals R$^2$, or a combination of these systems; where, in addition, two or more substituents R optionally forms a mono- or polycyclic, aliphatic or aromatic ring system with one another, and R$^2$ is in each case, independently of one another, H or an aliphatic or aromatic hydrocarbon radical having 1 to 20 C atoms.

3. The polymer according to claim 2, wherein the structural unit Z conforms to the formula Ia, Ib or Ic:

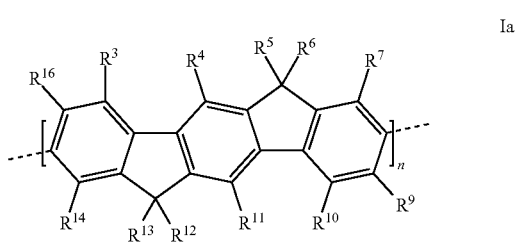

Ia

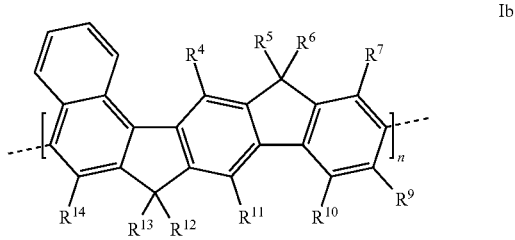

Ib

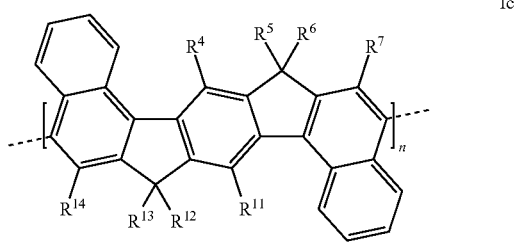

Ic where n≥1, and the dashed lines represent the bonds to the adjacent structural units in the polymer.

4. The polymer according to claim 1, wherein the structural unit Z conforms to the general formula II

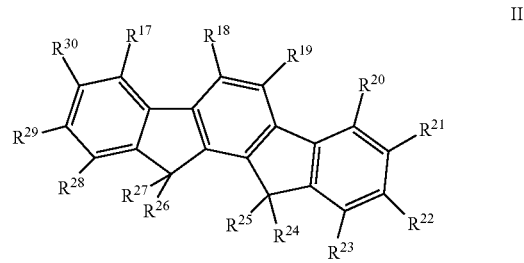

II where at least one of the radicals R$^{17}$ to R$^{30}$ denotes a bond to a further structural unit, at least one of the radicals R$^{17}$ to $R^{30}$ denotes a linear or branched alkylalkoxy group A which is bonded to the compound of the general formula II via a C atom and where the remaining radicals $R^{17}$ to $R^{30}$ in each case, independently of one another, a bond to a further structural unit or denotes H, D, F, Cl, Br, I, $N(R^2)_2$, $N(Ar)_2$, $C(=O)Ar$, $P(=O)Ar_2$, $S(=O)Ar$, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, CEC, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or an aromatic or heteroaromatic ring system having 5 to 40 aromatic ring atoms, which optionally in each case is substituted by one or more radicals $R^2$, or an aryloxy or heteroaryloxy group having 5 to 40 aromatic ring atoms, which is optionally substituted by one or more radicals $R^2$, or a combination of these systems; where, in addition, two or more substituents R optionally forms a mono- or polycyclic, aliphatic or aromatic ring system with one another, and $R^2$ is in each case, independently of one another, H or an aliphatic or aromatic hydrocarbon radical having 1 to 20 C atoms.

5. The polymer according to claim 4, wherein the structural unit Z conforms to the formula IIa, IIb or IIc:

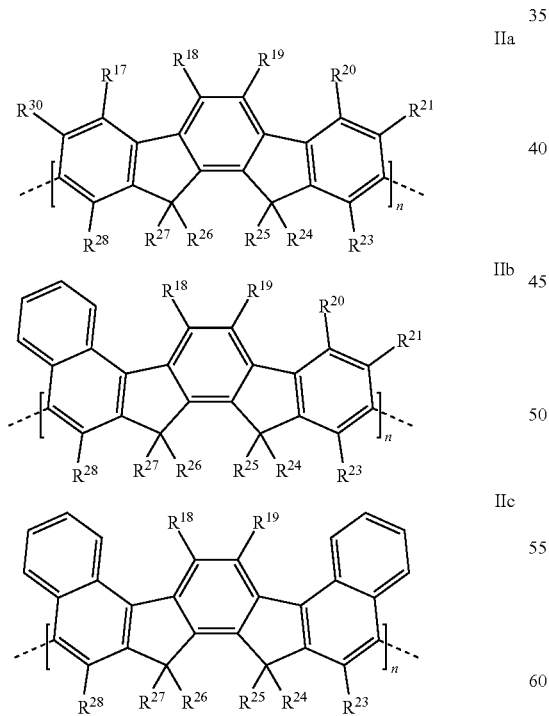

where n≥1, and the dashed lines represent the bonds to the adjacent structural units in the polymer.

6. The polymer according to claim 1, wherein the structural unit Z conforms to the formula IIIc, IIId, or IIIg:

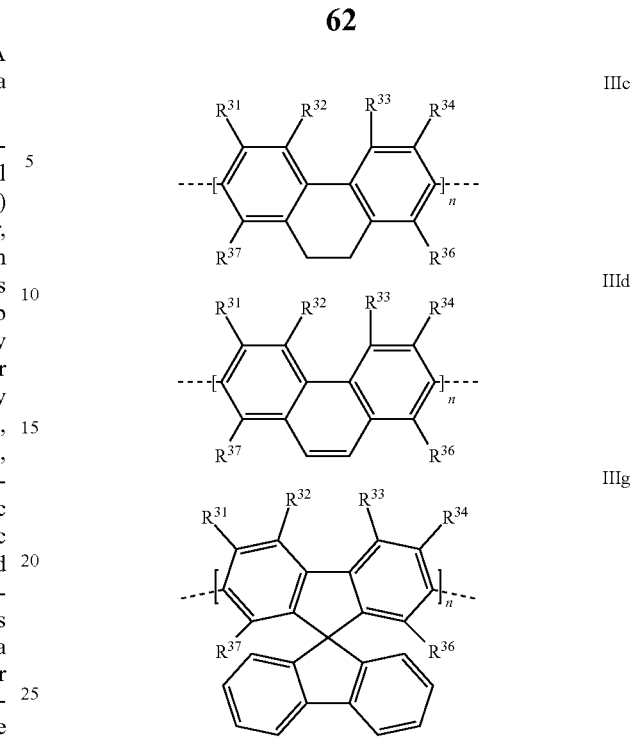

where n≥1, and the dashed lines represent the bonds to the adjacent structural units in the polymer.

7. The polymer according to claim 1, wherein the structural unit Z conforms to the general formula IV

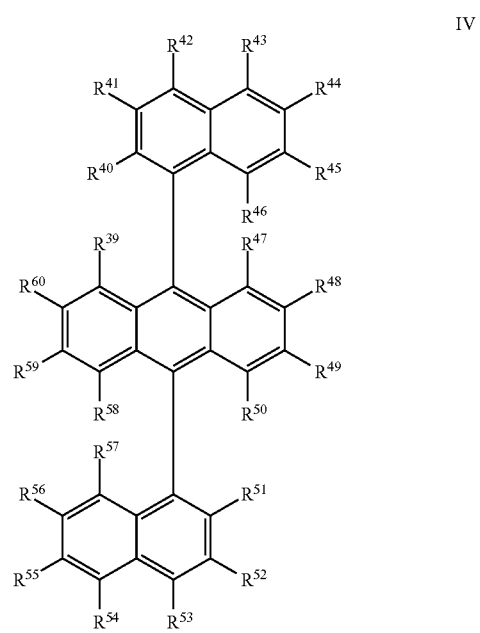

where at least one of the radicals $R^{39}$ to $R^{60}$ denotes a bond to a further structural unit, at least one of the radicals $R^{39}$ to $R^{60}$ denotes a linear or branched alkylalkoxy group A which is bonded to the compound of the general formula IV via a C atom, and the remaining radicals $R^{39}$ to $R^{60}$ in each case, independently of one another, a bond to a further structural unit or denotes H, D, F, Cl, Br, I, $N(R^2)_2$, $N(Ar)_2$, $C(=O)Ar$, P(=O)Ar$_2$, S(=O)Ar, S(=O)$_2$Ar, CR$^2$=CR$^2$Ar, CN, NO$_2$, Si(R$^2$)$_3$, B(OR$^2$)$_2$, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R$^2$, where one or more non-adjacent CH$_2$ groups is optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms is optionally replaced by F, Cl, Br, I, CN or NO$_2$, or an aromatic or heteroaromatic ring system having 5 to 40 aromatic ring atoms, which optionally in each case is substituted by one or more radicals R$^2$, or an aryloxy or heteroaryloxy group having 5 to 40 aromatic ring atoms, which is optionally substituted by one or more radicals R$^2$, or a combination of these systems; where, in addition, two or more substituents R optionally forms a mono- or polycyclic, aliphatic or aromatic ring system with one another, and R$^2$ is in each case, independently of one another, H or an aliphatic or aromatic hydrocarbon radical having 1 to 20 C atoms.

8. The polymer according to claim 7, wherein the structural unit Z conforms to the general formula IVa or IVb:

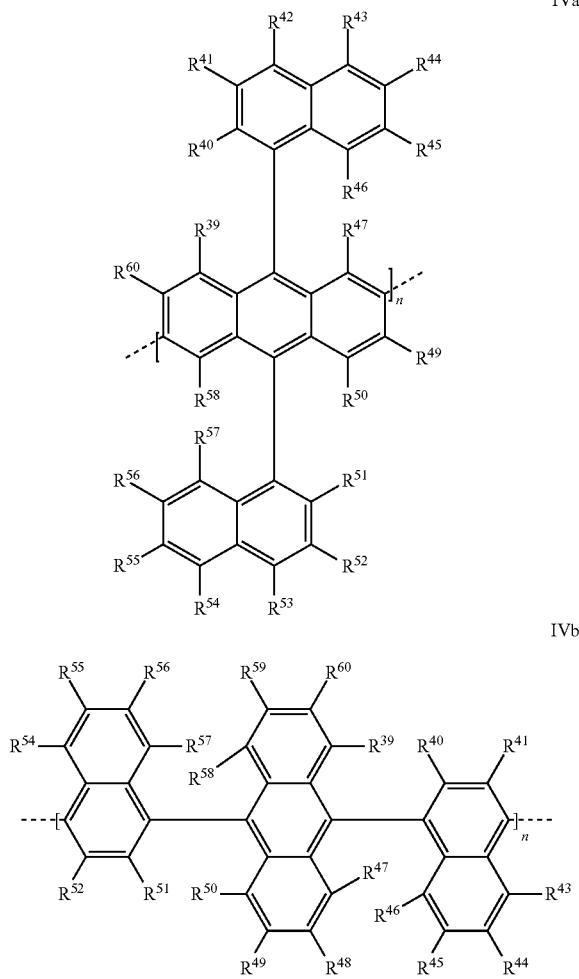

where n≥1, and the dashed lines represent the bonds to the adjacent structural units in the polymer.

9. The polymer according to claim 1, wherein the polymer comprises combinations of the structural units Z and/or one or more further structural units which are different from the structural unit Z.

10. The polymer according to claim 9, wherein the further structural units are a hole-injection, hole-transport, hole-blocking, electron-injection, electron-transport, electron-blocking, emitter, exciton-generating unit or a backbone unit.

11. The polymer according to claim 9, wherein a further structural unit is selected from the following structural units Va, Vb, Vc, Vd, Ve, Vf, Vg and Vh:

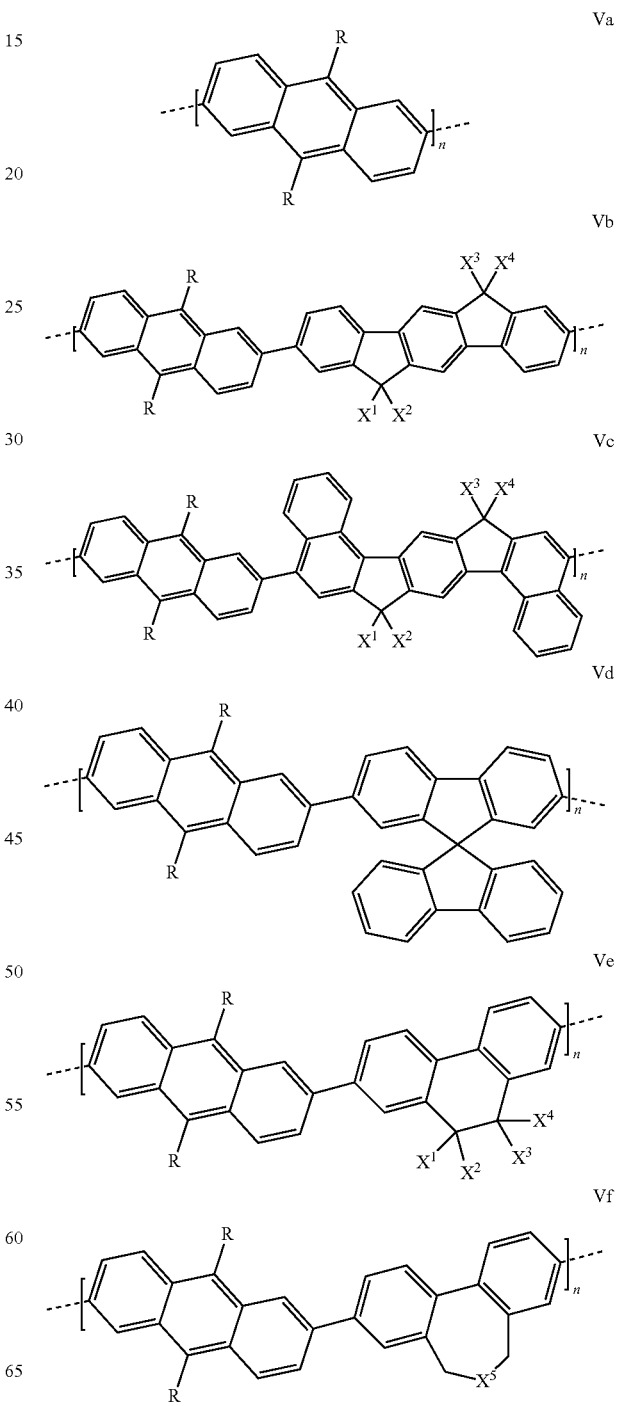

-continued

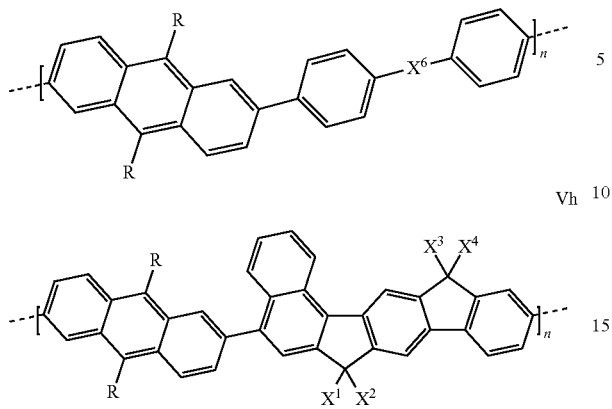

where R, independently of one another, identically or differently, can have the meanings indicated for $R^1$ or $Ar^1$ and $Ar^2$, $R^1$ is in each case, independently of one another, a bond to a further structural unit or denotes H, D, F, Cl, Br, I, $N(R^2)_2$, $N(Ar)_2$, $C(=O)Ar$, $P(=O)Ar_2$, $S(=O)Ar$, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $C≡C$, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or an aromatic or heteroaromatic ring system having 5 to 40 aromatic ring atoms, which optionally in each case is substituted by one or more radicals $R^2$, or an aryloxy or heteroaryloxy group having 5 to 40 aromatic ring atoms, which is optionally substituted by one or more radicals $R^2$, or a combination of these systems; where, in addition, two or more substituents R optionally forms a mono- or polycyclic, aliphatic or aromatic ring system with one another, $R^2$ is in each case, independently of one another, H or an aliphatic or aromatic hydrocarbon radical having 1 to 20 C atoms, $X^1$, $X^2$, $X^3$ and $X^4$ each, independently of one another, have the meanings indicated for $R^1$, $X^5$ is o, S or $NR^1$, $X^6$ is an alkylene group which is substituted by $R^1$ or unsubstituted, where one or more C atoms is optionally replaced by O, or is an aromatic ring system, $Ar^1$ and $Ar^e$ are each, independently of one another, an aromatic or heteroaromatic group, n≥1, and the dashed lines represent the bonds to the adjacent structural units in the polymer.

12. The polymer according to claim 1, wherein the polymer is a conjugated or partially conjugated polymer and/or a block copolymer.

13. A blend comprising a polymer according to claim 1 and at least one further organic, organometallic or polymeric compound.

14. The blend according to claim 13, wherein the further polymeric compound comprises structural units selected from a hole-injection, hole-transport, hole-blocking, electron-injection, electron-transport, electron-blocking, emitter, exciton-generating unit or a backbone unit, or combinations of the said structural units.

15. The blend according to claim 13, wherein the further polymeric compound comprises the structural units Va, Vb, Vc, Vd, Ve, Vf, Vg and Vh:

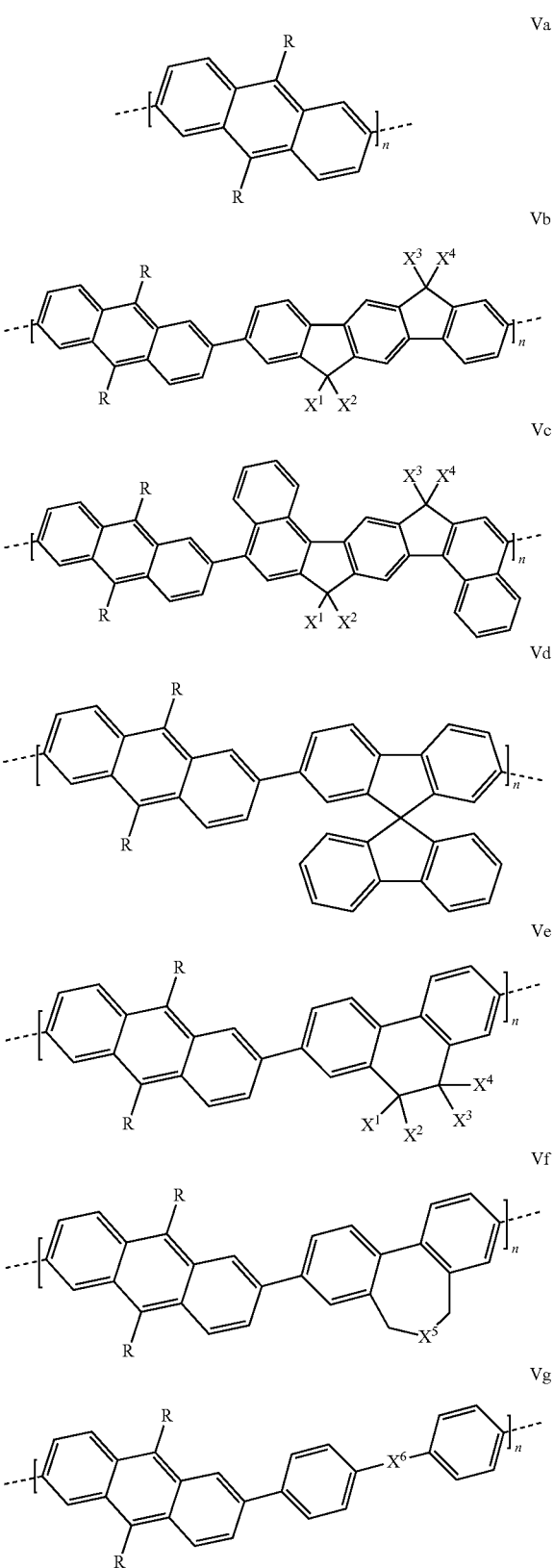

-continued

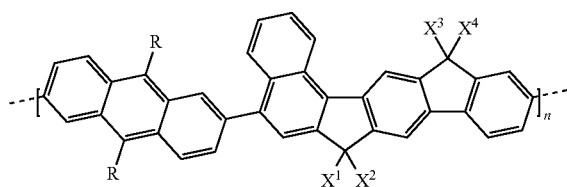

Vh where R, independently of one another, identically or differently, can have the meanings indicated for $R^1$ or $Ar^1$ and $Ar^2$, $R^1$ is in each case, independently of one another, a bond to a further structural unit or denotes H, D, F, Cl, Br, I, $N(R^2)_2$, $N(Ar)_2$, $C(=O)Ar$, $P(=O)Ar_2$, $S(=O)Ar$, $S(=O)_2Ar$, $CR^2=CR^2Ar$, CN, $NO_2$, $Si(R^2)_3$, $B(OR^2)_2$, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or an aromatic or heteroaromatic ring system having 5 to 40 aromatic ring atoms, which optionally in each case is substituted by one or more radicals $R^2$, or an aryloxy or heteroaryloxy group having 5 to 40 aromatic ring atoms, which is optionally substituted by one or more radicals $R^2$, or a combination of these systems; where, in addition, two or more substituents R optionally forms a mono- or polycyclic, aliphatic or aromatic ring system with one another, $R^2$ is in each case, independently of one another, H or an aliphatic or aromatic hydrocarbon radical having 1 to 20 C atoms.

$X^1$, $X^2$, $X^3$ and $X^4$ each, independently of one another, have the meanings indicated for $R^1$, $X^5$ is O, S or $NR^1$, $X^5$ is an alkylene group which is substituted by $R^1$ or unsubstituted, where one or more C atoms is optionally replaced by O, or is an aromatic ring system, $Ar^1$ and $Ar^e$ are each, independently of one another, an aromatic or heteroaromatic group, n≥1, and the dashed lines represent the bonds to the adjacent structural units in the polymer.

16. A blend comprising the polymer according to claim 1, a polymeric compound comprising an emitter unit and a polymeric compound comprising a hole-blocking unit.

17. The blend according to claim 13, wherein the blend comprises further polymers, each of which comprise, independently of one another, a hole-injection, hole-transport, hole-blocking, electron-injection, electron-transport, electron-blocking, emitter or exciton-generating unit.

18. A formulation comprising the polymer according to claim 1 and one or more solvents.

19. A formulation comprising the blend according to claim 13 and one or more solvents.

20. An organic electronic device comprising one or more layers, where at least one layer comprises the polymer according to claim 1.

21. An organic electronic device comprising one or more layers, where at least one layer comprises the blend according to claim 13.

22. Organic electronic device according to claim 21, wherein the electronic device is an organic electroluminescent device (OLED), a polymeric electroluminescent device (PLED), an organic integrated circuit (o-IC), an organic field-effect transistor (o-FET), an organic thin-film transistor (o-TFT), an organic light-emitting transistor (o-LET), an organic solar cell (o-SC), an organic optical detector, an organic photoreceptor, an organic field-quench device (o-FQD), a light-emitting electrochemical cell (LEC) or an organic laser diode (o-laser).

\* \* \* \* \*